(12) United States Patent
Shim et al.

(10) Patent No.: US 12,130,341 B2
(45) Date of Patent: Oct. 29, 2024

(54) METHOD AND APPARATUS FOR MEASURING MAGNETIC FIELD AND TEMPERATURE USING DIAMOND NITROGEN VACANCY SENSOR

(71) Applicant: KOREA RESEARCH INSTITUTE OF STANDARDS AND SCIENCE, Daejeon (KR)

(72) Inventors: Jeong Hyun Shim, Daejeon (KR); Sang Won Oh, Daejeon (KR); Ki Woong Kim, Daejeon (KR); Kwang Geol Lee, Seoul (KR)

(73) Assignee: KOREA RESEARCH INSTITUTE OF STANDARDS AND SCIENCE, Daejeon (KR)

(*) Notice: Subject to any disclaimer, the term of this patent is extended or adjusted under 35 U.S.C. 154(b) by 157 days.

(21) Appl. No.: 17/991,087

(22) Filed: Nov. 21, 2022

(65) Prior Publication Data
US 2024/0168106 A1    May 23, 2024

(51) Int. Cl.
*G01R 33/032*    (2006.01)
*G01R 33/00*    (2006.01)

(52) U.S. Cl.
CPC ....... *G01R 33/032* (2013.01); *G01R 33/0017* (2013.01); *G01R 33/0082* (2013.01)

(58) Field of Classification Search
CPC .............. G01R 33/032; G01R 33/0017; G01R 33/0082
See application file for complete search history.

(56) References Cited

U.S. PATENT DOCUMENTS 10,145,910 B2* 12/2018 Jackson ................. G01R 33/26
2019/0235031 A1* 8/2019 Ibrahim ................. G11C 13/06
2019/0317173 A1* 10/2019 Connolly ............... G01R 33/00

* cited by examiner

*Primary Examiner* — Giovanni Astacio-Oquendo
*Assistant Examiner* — Zannatul Ferdous
(74) *Attorney, Agent, or Firm* — Tarolli, Sundheim, Covell & Tummino LLP

(57) ABSTRACT

Disclosed is a method and apparatus for measuring magnetic field and/or temperature using a diamond nitrogen-vacancy center sensor, and a measuring apparatus based on a diamond nitrogen-vacancy center (DNV) sensor may include: a diamond nitrogen-vacancy center sensor; a frequency synthesizer for generating a first reference signal and a second reference signal; a first microwave generator for generating a first microwave that is frequency modulated according to the first reference signal and causes a first spin transition in the diamond nitrogen-vacancy center sensor; a second microwave generator for generating a second microwave that is frequency modulated according to the second reference signal and causes a second spin transition in the diamond nitrogen-vacancy center sensor; a laser irradiator for applying a laser to excite the spin state of the diamond nitrogen-vacancy center sensor; a power amplifier for combining and amplifying the first microwave and the second microwave to apply to the diamond nitrogen-vacancy center sensor; a detector for detecting a fluorescence signal output from the diamond nitrogen-vacancy center sensor; a reference detector for measuring power of the laser; a differential circuit for outputting the difference between an output signal of the detector and an output signal of the reference detector; a first lock-in amplifier for outputting a result of comparing an output of the differential circuit with the first reference signal, and a second lock-in amplifier for outputting a result of comparing an output of the differential circuit with the second reference signal. Using the apparatus, it is possible to remove an influence of the temperature when measuring the (Continued)

magnetic field, and remove an influence of a change in the magnetic field when measuring the temperature, thereby enabling more precise measurement.

15 Claims, 16 Drawing Sheets

METHOD AND APPARATUS FOR MEASURING MAGNETIC FIELD AND TEMPERATURE USING DIAMOND NITROGEN VACANCY SENSOR

TECHNICAL FIELD

Various embodiments relate to a method and apparatus for measuring a magnetic field and/or temperature using a diamond nitrogen-vacancy center sensor.

BACKGROUND ART

Diamond crystals are made up of carbon atoms, but when carbon atoms are replaced by other types of atoms, lattice defects occur. One of the defects is a nitrogen-vacancy center, in which one carbon atom is replaced by a nitrogen atom and the neighboring carbon atom is removed, leaving a blank space.

A diamond nitrogen-vacancy center (DNV) has an electron spin with a spin number (S) of 1, so the spin may have three spin states ($m_s$) which are +1, 0 and −1. In the absence of an external magnetic field in an axial direction of the nitrogen-vacancy center in diamond, the +1 and −1 spin states (m s) overlap and exist at similar energy levels, but in the presence of an external magnetic field along the axial direction of the nitrogen-vacancy center in diamond, due to the Zeeman effect, the overlap of the spin states of the nitrogen-vacancy center in the +1 and −1 spin states ($m_s$) disappears and the spin states exist at different energy levels, so the spin of the nitrogen-vacancy center can have two resonance frequencies corresponding to the transition between the spin state ($m_s$=0) and the spin state ($m_s$=+1) or between the spin state ($m_s$=0) and the spin state ($m_s$=−1). The difference between the two resonance frequencies is proportional to the magnitude of the external magnetic field.

When a laser of 532 nm wavelength is irradiated to the diamond nitrogen-vacancy center, the spin state ($m_s$=0) is excited and then returns to the ground state by emitting red light over 630 nm, and the spin state ($m_s$=+1) and the spin state ($m_s$=−1) are excited and return to the ground state while changing to the spin state ($m_s$=0) without emitting red light. Therefore, the amount of fluorescence of the emitted red light may be proportional to probability (or population) of the spin state ($m_s$=0).

Applying two resonance frequencies corresponding to spin transitions to the diamond nitrogen-vacancy center causes a transition from a spin state ($m_s$=0) to a spin state ($m_s$=+1) or a spin state ($m_s$=−1). As a result, the probability of the spin state ($m_s$=0) is reduced, and thus the amount of fluorescence of emitted red light is also reduced.

Therefore, by recording the change in fluorescence according to frequency while applying a microwave frequency to the diamond nitrogen-vacancy center, an optically detected magnetic resonance (ODMR) spectrum with reduced fluorescence intensity at the resonance frequency corresponding to each spin transition may be obtained. In this ODMR spectrum, the magnitude of the magnetic field applied to the diamond nitrogen-vacancy center may be determined based on the difference between the two resonance frequencies having reduced fluorescence intensity.

DISCLOSURE

Technical Problem

The resonance frequency of the spin of the nitrogen-vacancy center in the absence of magnetic field, which is named zero-field splitting (D), may change depending on temperature. This effect stems from the thermally induced volume change in a diamond crystal. The zero-field splitting influences the resonance frequencies of the two transitions from the spin state (ms=0) to the spins state (ms=1) and the spin state (ms=0) to the spin state (ms=−1). Therefore, the accuracy of the measured external magnetic field may degrade since a temperature of the diamond may vary in time due to external heat sources and that may affect the resonance frequencies used for measuring the magnetic field.

Therefore, the present invention aims to provide a method and apparatus for measuring a change in the magnetic field using the diamond nitrogen-vacancy center, without the influence of the change in D due to the variation in the temperature.

In addition, conversely, the present invention aims to provide a method and apparatus for measuring the temperature precisely using the diamond nitrogen-vacancy center, without the influence of the change in the magnetic field.

In addition, the present invention aims to provide a method and apparatus that can precisely measure the changes in the magnetic field and the temperature at the same time using the diamond nitrogen-vacancy center.

The technical problems to be achieved in the present disclosure are not limited to the technical problems mentioned above, and other technical problems not mentioned may be clearly understood by those skilled in the art to which the present invention belongs from the description below.

Technical Solution

According to various embodiments of the present disclosure, one embodiment is a measurement apparatus based on a diamond nitrogen-vacancy center (DNV) sensor, including: a diamond nitrogen-vacancy center sensor; a frequency synthesizer for generating a first reference signal and a second reference signal; a first microwave generator for generating a first microwave that is frequency modulated based on the first reference signal and causes a first spin transition in the diamond nitrogen-vacancy center sensor; a second microwave generator for generating a second microwave that is frequency modulated based on the second reference signal and causes a second spin transition in the diamond nitrogen-vacancy center sensor; a laser irradiator for applying a laser to excite the spin state of the diamond nitrogen-vacancy center sensor; a power amplifier for amplifying the first microwave and the second microwave to apply to the diamond nitrogen-vacancy center sensor; a detector for detecting a fluorescence signal output from the diamond nitrogen-vacancy center sensor; a reference detector for measuring power of the laser; a differential circuit for outputting a difference between an output signal of the detector and an output signal of the reference detector; a first lock-in amplifier for outputting a result of comparing an output of the differential circuit with the first reference signal, and a second lock-in amplifier for outputting a result of comparing an output of the differential circuit with the second reference signal.

According to various embodiments of the present disclosure, another embodiment is a method for measurement based on a diamond nitrogen-vacancy center sensor, including: setting a parameter for measurement; generating a first reference signal and a second reference signal; applying, to the diamond nitrogen-vacancy center sensor, a first microwave that is frequency modulated based on the first reference signal and causes a first spin transition and a second microwave that is frequency modulated based on the second reference signal and causes a second spin transition; applying a laser to excite a spin quantum to the diamond nitrogen-vacancy center sensor; outputting a differential signal indicating a difference between a fluorescence signal outputted from the diamond nitrogen-vacancy center sensor and an output signal of the laser; outputting a first result obtained by comparing the differential signal with the first reference signal; outputting a second result obtained by comparing the differential signal with the second reference signal; and measuring a change in a magnetic field and/or temperature based on the first result and/or the second result.

Advantageous Effect

According to various embodiments, the present invention may more precisely measure a change in the magnetic field using the diamond nitrogen-vacancy center, by eliminating the influence of the change in the temperature.

According to various embodiments, the present invention may more precisely measure a change in the temperature using the diamond nitrogen-vacancy center, by eliminating the influence of the change in the external magnetic field.

According to various embodiments, it is possible to measure a magnetic field and a temperature simultaneously using the diamond nitrogen vacancy center, with a minimally suppressed mutual interference.

Effects obtainable in the present disclosure are not limited to the above-mentioned effects, and other effects not mentioned may be clearly understood by those skilled in the art to which the present disclosure belongs from the description below.

DETAILED DESCRIPTION

Hereinafter, various embodiments will be described in detail with reference to the accompanying drawings.

Figure 1:
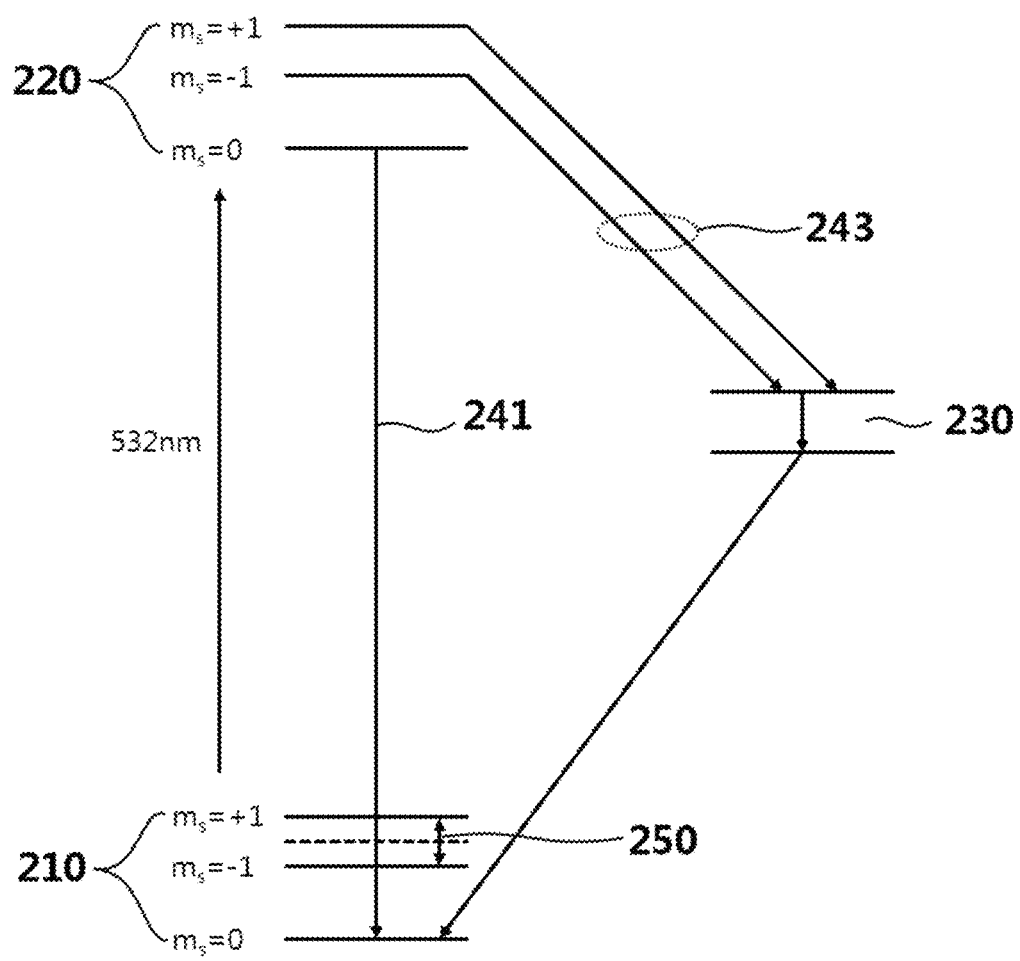
FIG. 1 is a diagram showing an energy level diagram of the diamond nitrogen-vacancy center.

FIG. 1 is a diagram showing an energy level diagram of the diamond nitrogen-vacancy center.

Referring to FIG. 1, a diamond nitrogen-vacancy center has a ground state 210 having spin triplet which are three spin states: a spin state ($m_s=0$), a spin state ($m_s=+1$) and a spin state ($m_s=-1$) symmetrical to each other. In the absence of magnetic field, by spin-spin interaction, the spin state ($m_s=+1$) and the spin state ($m_s=-1$) are in the same energy state away from the spin state ($m_s=0$) by a certain energy level. In the absence of magnetic field, the energy level of the spin state ($m_s=0$) is separated from the energy level of the spin state ($m_s=+1$) and spin state ($m_s=-1$) by approximately 2.87 GHz of frequency (=energy/Planck constant).

When an external magnetic field is applied in the ground state 210, the energy of the spin state ($m_s=+1$) and the spin state ($m_s=-1$) becomes to have an energy level 250 that is separated in proportion to the magnitude of the external magnetic field.

The spin state of the diamond nitrogen-vacancy center in the ground state 210 is excited and becomes in the excited state 220 when a green light is irradiated. The green light may be a light having a wavelength of 637 nm or less, preferably light having a wavelength of 532 nm. At this time, the spin state of the diamond nitrogen-vacancy center is excited while maintaining its spin state.

The spin quantum in the excited state 220 returns to the ground state 210 and most of the spin quanta in the spin state ($m_s=0$) emit photons of red light (e.g., 600 nm or more to 900 nm or less) and return to the ground state 210 of a spin state ($m_s=0$) (241), and certain portion thereof returns to the ground state 210 through a singlet 230 (243). When the spin state is either the spin state (ms=+1) or the spin state (ms=−1), it passes through the singlet 230, and, then, returns to the ground state 210 without emitting red light.

Most of the spin states of the diamond-nitrogen vacancy center in the spin state ($m_s=+1$) and in the spin state ($m_s=-1$) of the excited state 220 return to the ground state 210 through the singlet 230, and the spin state returns to the spin state ($m_s=0$) rather than the original spin state ($m_s=\pm1$). Therefore, when green light is irradiated, the spin state of the diamond nitrogen-vacancy center results in the spin state ($m_s=0$) after a certain time.

On the other hand, when a resonance frequency corresponding to the energy difference between a spin state ($m_s$=0) and a spin state ($m_s$=+1) or between a spin state ($m_s$=0) and a spin state ($m_s$=−1) is applied, the transition from the spin state ($m_s$=0) of the ground state 210 to the spin state ($m_s$=+1) or spin state ($m_s$=−1) is induced. Each resonance frequency (F) under an external magnetic field (B) is determined by F=D±γB. Here, D may have a value of 2.87 GHz as a resonance frequency in the absence of a magnetic field, that is, a resonance frequency of zero field splitting, and γ may have a value of 28 MHz/mT as gyromagnetic ratio of electron spin.

When green light (e.g., light with a wavelength of 532 nm) is applied to the spin state of the ground state 210 of the diamond nitrogen-vacancy center, the spin state is excited to be in the excited state 220, and mostly the spin in the state ($m_s$=+1) and in the state ($m_s$=−1) of the excited state 220 return to the ground state 210 without emitting red light through 243 in FIG. 1, and the spin state (ms=0) of the excited state 220 returns to the ground state 210 while emitting red light over 600 nm along 241 of FIG. 1. At this time, the spin state ($m_s$=±1) is converted to the spin state ($m_s$=0) and returns to the ground state 210.f Therefore, if an optically-detected magnetic resonance (ODMR) spectrum that shows the change in the amount of emitted light using a photodiode with varying the frequency of the applied microwave, is recorded, the peaks with low light intensities at two resonance frequencies corresponding to the energy difference between the spin state ($m_s$=0) and the spin state ($m_s$=+1), and the energy difference between the spin state ($m_s$=0) and the spin state ($m_s$=−1) may be observed.

Figure 2:
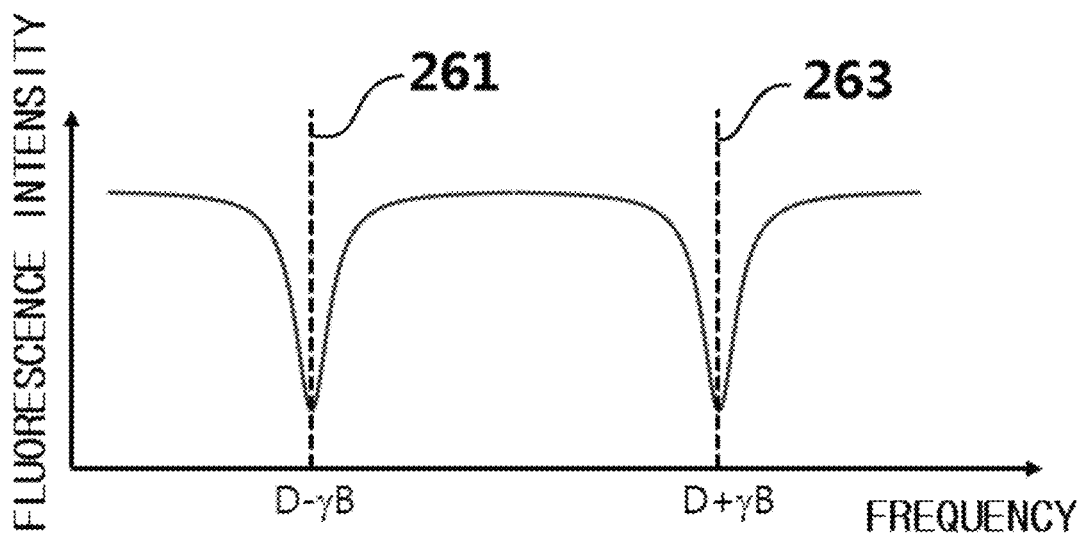
FIG. 2 is a view illustrating an example of an ODMR spectrum.

FIG. 2 is a view illustrating an example of an ODMR spectrum.

Referring to FIG. 2, the ODMR spectrum shows tow peaks at the resonance frequencies corresponding to the energy difference 263 between a spin state ($m_s$=0) and a spin state ($m_s$=+1), or the energy difference 261 between the spin state ($m_s$=0) and the spin state ($m_s$=−1). When a frequency other than the corresponding resonance frequency is applied, the spin state ($m_s$=0) of the ground state 210 is not excited into a spin state ($m_s$=+1) or a spin state ($m_s$=−1), but a spin state ($m_s$=0) remains. Further, when excited to the excited state 220 by green light, the spin state of the diamond nitrogen-vacancy center remaining in the spin state ($m_s$=0) emits a photon of red light and returns to the ground state 210 along a path 241 of FIG. 1. To the contrary, when the corresponding resonance frequency is applied, the spin quantum in the spin state ($m_s$=0) of the ground state 210 is converted to the spin state ($m_s$=+1) or the spin state ($m_s$=−1), and after being excited to the excited state 220 again by the green light, the spin state returns to the ground state 210 without emitting the photon of red light through a path 243 of FIG. 1, so the amount of light measured by the photodiode is reduced. Therefore, the amount of light measured at the two resonance frequencies corresponding to the energy difference 263 between the spin state ($m_s$=0) and the spin state ($m_s$=+1) and the energy difference 261 between the spin state ($m_s$=0) and the spin state ($m_s$=−1) becomes low. In addition, the difference between these two frequency bands is proportional to the intensity of the magnetic field applied to the diamond nitrogen-vacancy center. Thus, the diamond nitrogen-vacancy center may be used to detect an existing magnetic field or a change in the magnetic field.

When obtaining an ODMR spectrum as illustrated in FIG. 2, a frequency modulation technique may be used to improve the signal-to-noise ratio.

Figure 3:
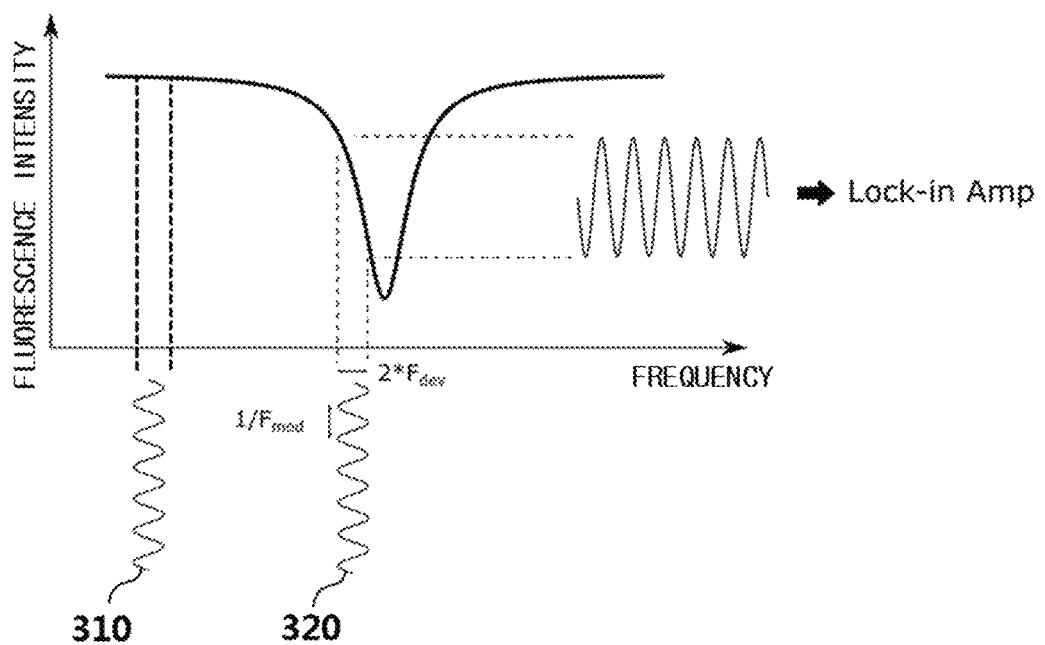
FIG. 3 is a view illustrating an example of obtaining an ODMR spectrum by applying a microwave of which a frequency is modulated to a specific reference signal and comparing a phase of a reference signal component only among signals generated by a photodetector.
Figure 4:
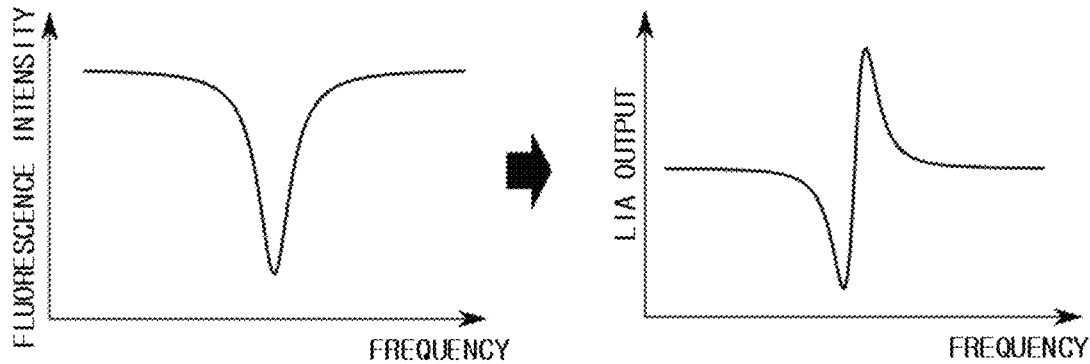
FIG. 4 is a view illustrating an example of an output of the lock-in amplifier.

FIG. 3 is a view illustrating an example of obtaining an ODMR spectrum by applying a microwave of which a frequency is modulated to a specific reference signal and comparing a phase of the reference signal component with the signal from the photodetector, and FIG. 4 is a view illustrating an example of an output of the lock-in amplifier.

Referring to FIG. 3, when a microwave 310 obtained by frequency-modulation according to a reference signal is off-centered from the resonance frequency, the signal generated by the photodetector has almost no reference signal component because there is almost no inclination. On the other hand, when the microwave 320 of which the reference signal is frequency-modulated is at near the center of the resonance frequency, the inclination in the corresponding region is large, and thus, the reference signal component appears out of the signal detected by the photodetector. Accordingly, the reference signal may be detected by using a lock-in amplifier (LIA) capable of extracting the frequency of the reference signal. If frequency modulation shown in FIG. 3 is used, the intensity of the reference signal can be relatively increased compared to that of noise, and the signal-to-noise ratio may be improved by avoiding the influence of noise present in a low frequency band of the signal. As shown in FIG. 3, the magnitude of the signal input to the lock-in-amplifier signal is proportional to the inclination of the ODMR spectrum, and an output of the lock-in-amplifier signal obtained through the frequency modulation technique has a differential form of the original ODMR spectrum, and becomes a signal output as shown in FIG. 4. Accordingly, the resonance frequency may be detected by recording the output of the lock-in-amplifier as shown in FIG. 4.

Figure 5:
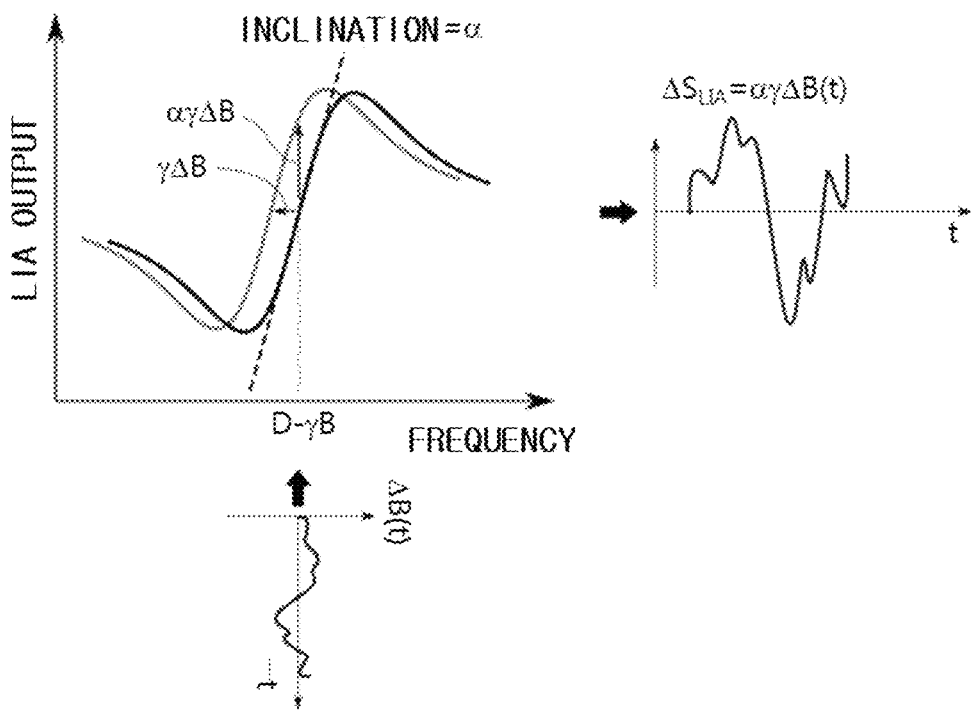
FIGS. 5 and 6 are views illustrating examples of changes in the output of the lock-in amplifier according to a change in an external magnetic field.
Figure 6:
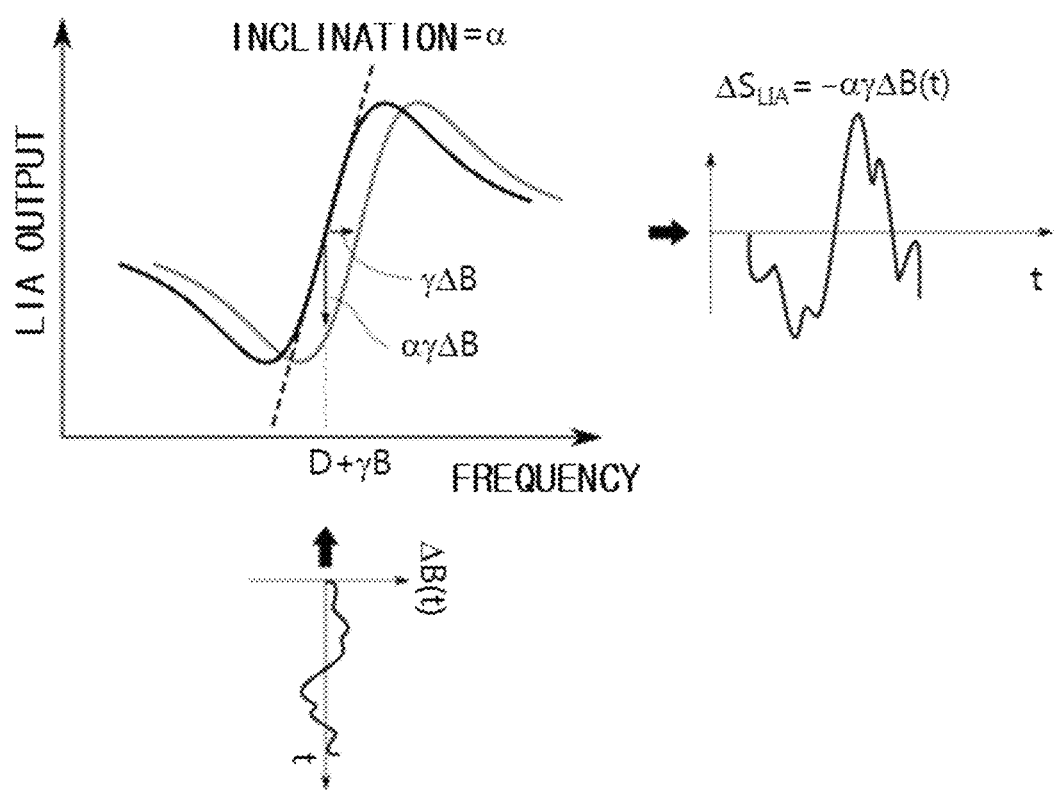

FIGS. 5 and 6 are views illustrating examples of the changes in the output of the lock-in amplifier according to the change in an external magnetic field.

Referring to FIG. 5, when a center frequency of the frequency-modulated microwave is fixed to D−γB which is a resonance frequency for the transition from the spin state ($m_s$=0) to the spin state ($m_s$=−1). When the external magnetic field changes by ΔB, the spectrum shifts toward a lower frequency and an output of the lock-in amplifier changes. This change ($\Delta S_{LIA}$) is given as αγΔB.

Referring to FIG. 6, the center frequency of the frequency-modulated microwave is fixed to D+γB, which is the resonance frequency for the transition from the spin state ($m_s$=0) to the spin state ($m_s$=+1). When the external magnetic field changes by ΔB, the spectrum shifts toward a higher frequency and the output of the lock-in amplifier changes. This change ($\Delta S_{LIA}$) is given as −αγΔB. Accordingly, it is possible to measure the change in the phase-inverted magnetic field.

Through this principle, a change in the external magnetic field to be measured (ΔB(t)) can be measured through a change in an output of the lock-in amplifier ($\Delta S_{LIA}$). At this time, the change ($\Delta S_{LIA}$) of the output of the lock-in amplifier is proportional to a zero-crossing inclination (α) of the spectrum.

The nitrogen ($^{14}$N) of the diamond nitrogen-vacancy center has a nuclear spin (I=1), and has an ultrafine interaction ($A_{zz}$) with an electron spin of the diamond nitrogen-vacancy center. The Hamiltonian (H) of the two spins is given by a mathematical formula 1 below.

$$\mathcal{H} = DS_z^2 + \gamma B + QI_z^2 + A_{zz}S_zI_z \quad \text{[mathematical formula 1]}$$

Here, Q is a nuclear quadrupole resonance value of nitrogen ($^{14}$N) which is approximately 5 MHz, and $A_{zz}$ has a magnitude of approximately 2.1 MHz.

Figure 7:
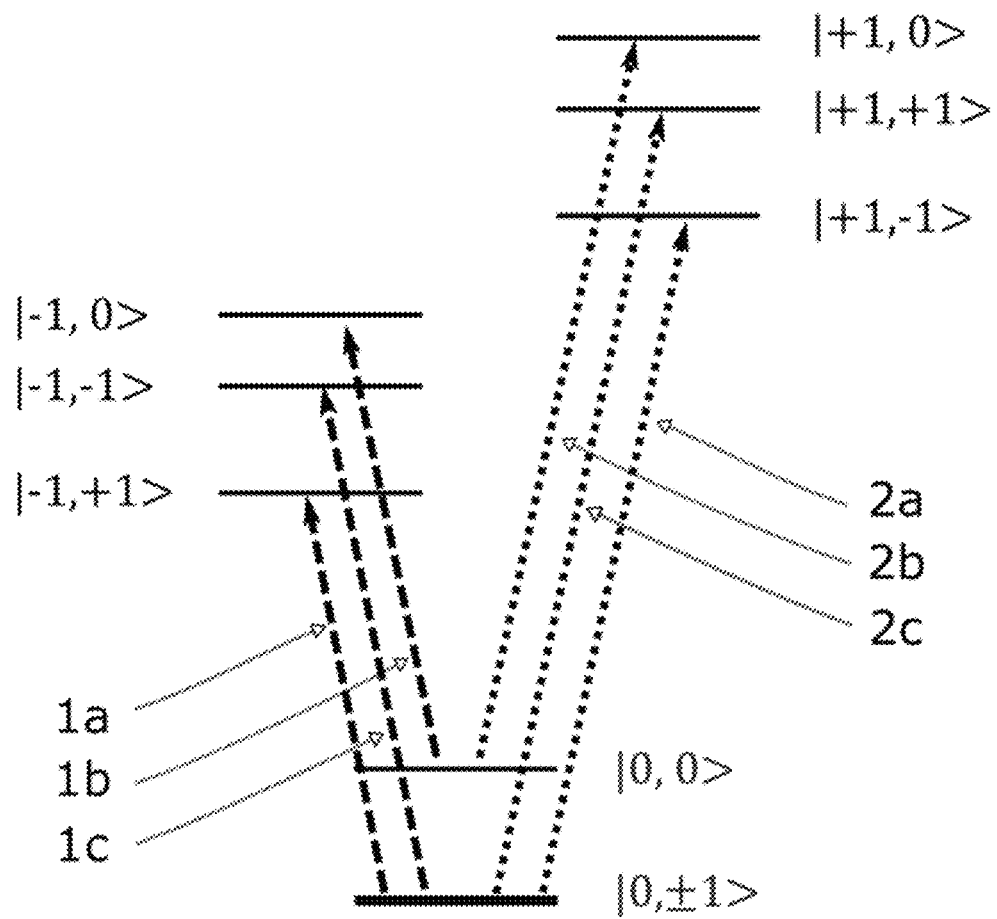
FIG. 7 is a view illustrating a transition between each spin state in an energy level diagram when nitrogen ($^{14}N$) nuclear spin is considered.

FIG. 7 is a view illustrating a transition between each spin state in an energy level diagram when nitrogen ($^{14}$N) nuclear spin is considered.

Figure 8:
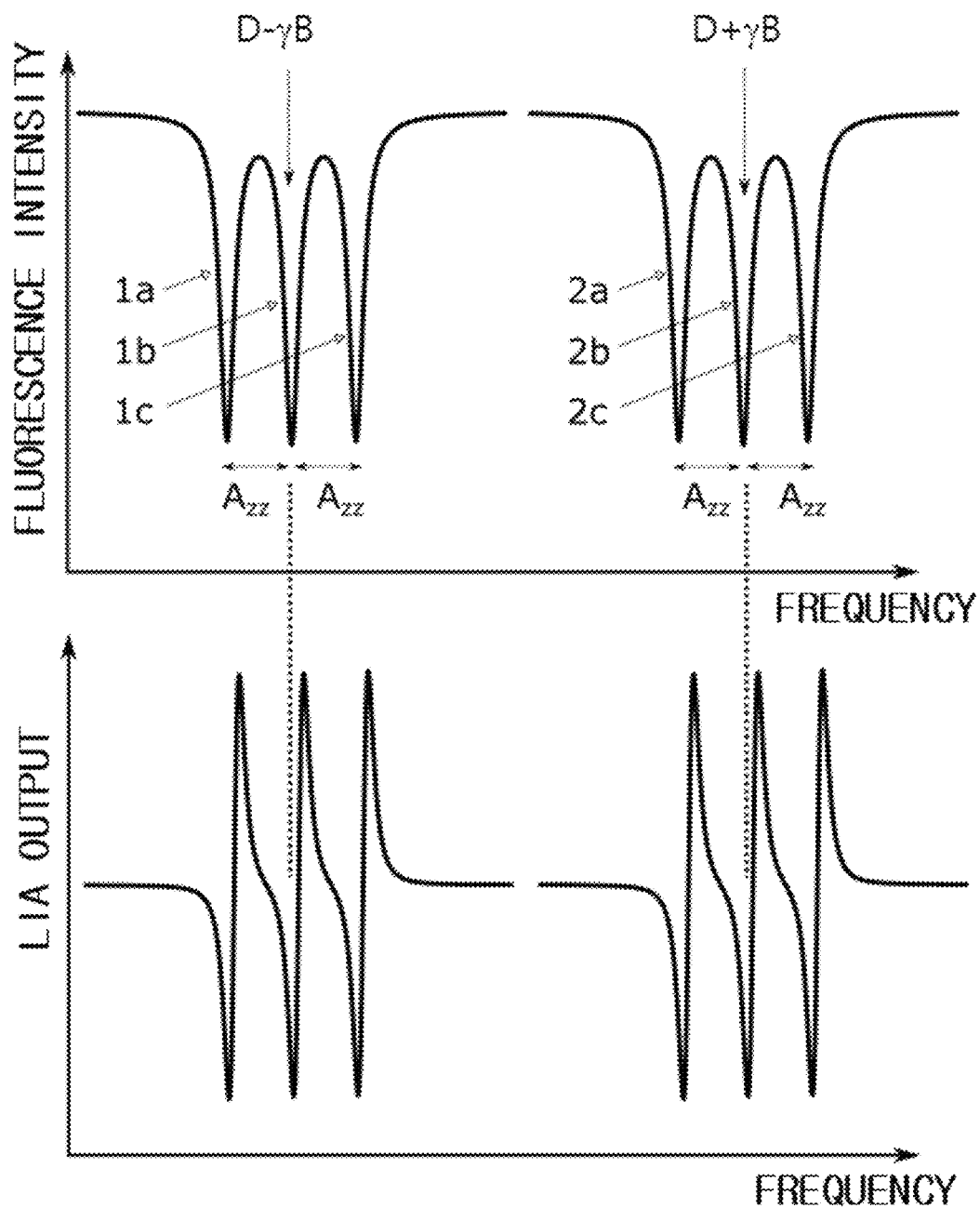
FIG. 8 is a view illustrating an example of an ODMR spectrum and an output of the lock-in amplifier when nitrogen ($^{14}N$) nuclear spin is considered.

FIG. 8 is a view illustrating an example of an ODMR spectrum and an output of the lock-in amplifier when nitrogen ($^{14}$N) nuclear spin is considered.

As illustrated in FIG. 7, when the states of two spins are described as $|m_s$ and $m_I\rangle$, a total of nine states exist, and six spin transitions can be induced through microwaves. In the ODMR of the diamond nitrogen-vacancy center aligned in a magnetic field direction, peaks separated on right and left sides by $A_{zz}$ with respect to the $D\pm\gamma B$ frequency are added and may appear as illustrated in FIG. 8. Accordingly, the output of the lock-in-amplifier measured by the frequency modulation technique may also have 6 peaks.

As illustrated in FIG. 3, a change in an external magnetic field may be measured using the frequency-modulated microwave and the lock-in amplifier. However, as shown in FIG. 5, 6 or 8, the zero-field splitting (D) may change with temperature. According to the results of previous studies, when the temperature of diamond increases, D has a dependence of approximately −74.2 kHz/K at room temperature. The 532 nm laser applied to the diamond to excite the spin state is partially absorbed and converted into heat. In other words, the 532 nm laser used to measure the magnetic field may cause the diamond's temperature to continuously increase. Also, depending on the measurement environment, the temperature of the diamond may change in time. Therefore, in a general situation, D should be considered as a time-varying value (D(t)) rather than a constant, and in this case, the change is given as $\Delta S_{LIA}(t)=\pm\alpha\{D(t)+\gamma\Delta B(t)\}$. According to this equation, it is impossible to distinguish whether the measured change in the output of the lock-in-amplifier is due to an external magnetic field, or the change in the zero-field splitting (D) due to the change in the temperature of the diamond. This problem may act as a factor hindering precise measurement of magnetic field or temperature, which is the application purpose of the diamond nitrogen-vacancy center. Therefore, in order to implement stable and precise measurement of magnetic field or temperature using the diamond nitrogen-vacancy center, the present disclosure proposes an apparatus for driving a dual-frequency microwave and a method thereof that simultaneously excites the spin transitions from the spin state ($m_s=0$) to the spin state ($m_s=-1$) and from the spin state ($m_s=0$) and to the spin state ($m_s=-1$).

In the case of simultaneously inducing the spin transitions from the spin state ($m_s=0$) to the spin state ($m_s=+1$) and from the spin state ($m_s=0$) to the spin state ($m_s=-1$) using a dual frequency microwave, it is possible to suppress the influence of the change of the zero-field splitting (D(t)) caused by the increase in temperature, or the influence of the change of the magnetic field (B(t)) which is randomly changed in the surroundings. In addition, it is possible to double the sensitivity of the magnetic field or the temperature intended to measure by doubling the inclination of the zero-crossing.

Figure 9:
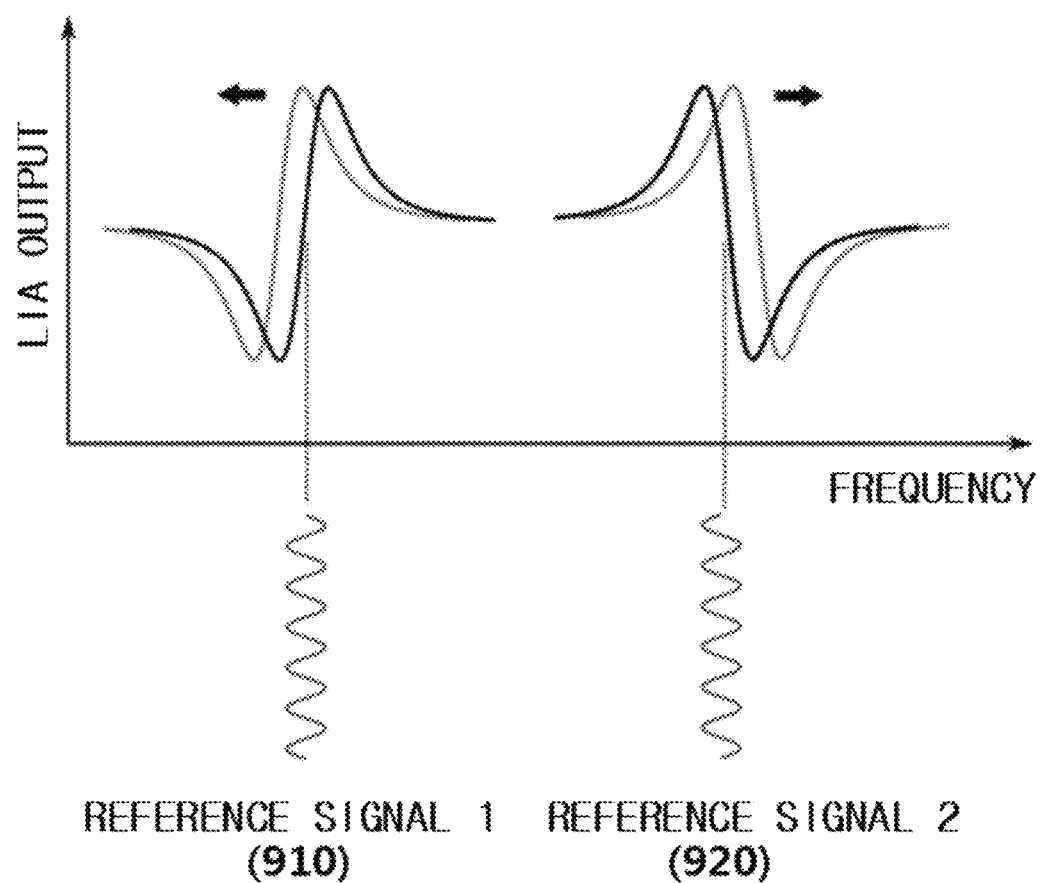
FIGS. 9 and 10 are views for explaining an operation in the case of applying a double-frequency modulated microwave to the diamond nitrogen-vacancy center.
Figure 10:
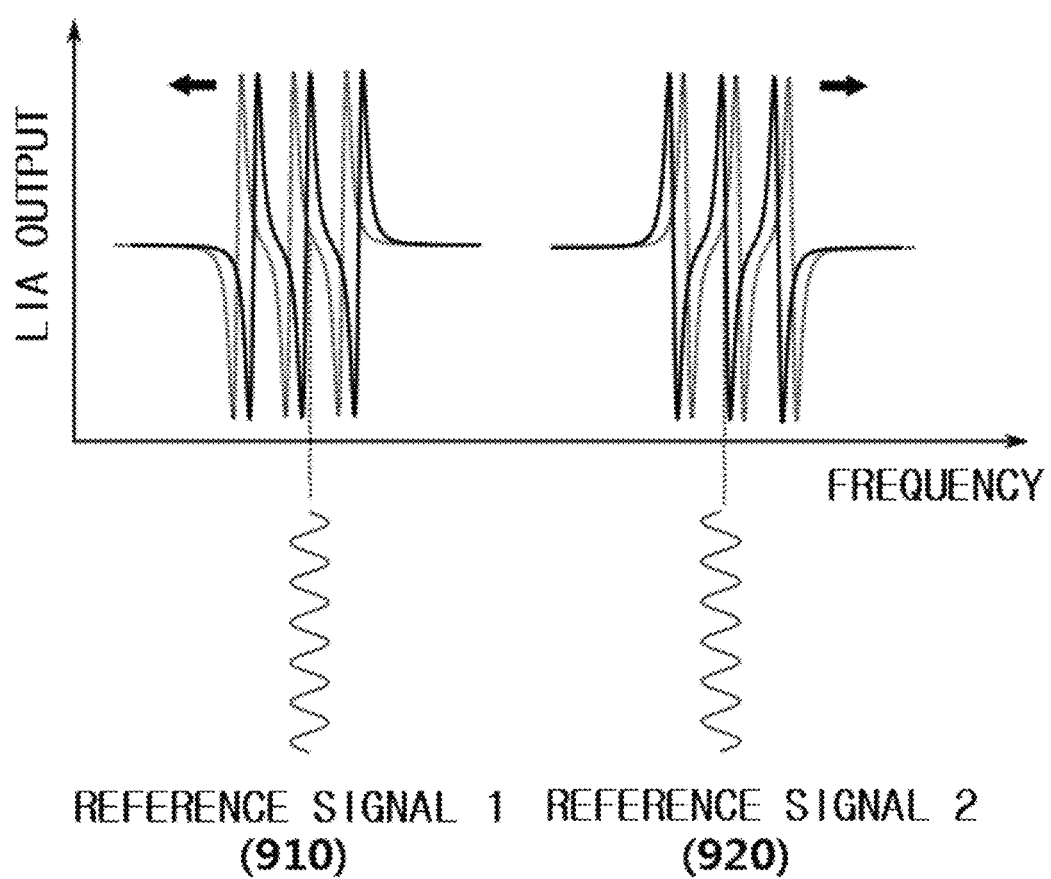

FIGS. 9 and 10 are views for explaining an operation in the case of applying a double-frequency modulated microwave to the diamond nitrogen-vacancy center.

As illustrated in FIG. 9, it is possible to apply microwave signals having the frequencies corresponding to the transition between the spin state ($m_s=0$) and the spin state ($m_s=-1$) and to the transition between the spin state ($m_s=0$) and the spin state ($m_s=+1$), to the diamond nitrogen-vacancy center. In this case, the microwave signal may be frequency-modulated according to the reference signals 910 and 920. In this case, the phase of the first reference signal 910 and the second reference signal 920 may be inverted by 180 degrees to measure the change in the magnetic field.

The change in the external magnetic field (ΔB) and the change in the zero-field splitting (ΔD) may occur simultaneously, and the microwave signal that is frequency-modulated based on the first reference signal 910 causing the spin transition between the spin state ($m_s=0$) and the spin state ($m_s=-1$) and the microwave signal that is frequency modulated based on the second reference signal 920 causing the spin transition between the spin state ($m_s=0$) and the spin state ($m_s=-1$) may be applied simultaneously. According to the embodiment, when the second reference signal 920 has the same frequency as the first reference signal 910 and the phase thereof is inverted by 180 degrees, the lock-in-amplifier signal change ($\Delta S_{LIA,1}$) obtained based on the microwave signal frequency-modulated based on the first reference signal 910 is given as $\Delta S_{LIA,1}=-\alpha(\Delta D-\gamma\Delta B)$, and the lock-in-amplifier signal change ($\Delta S_{LIA,2}$) obtained based on the microwave signal frequency-modulated based on the second reference signal 920 is given as $\Delta S_{LIA,2}=+\alpha(\Delta D+\gamma\Delta B)$. Therefore, the change ($\Delta S_{LIA}$) in the entire lock-in-amplifier output signal becomes $\Delta S_{LIA}=\Delta S_{LIA,1}+\Delta S_{LIA,2}=2\alpha\gamma\Delta B$, in which the influence of ΔD disappears and at the same time, the magnitude of the signal of which the change in the magnetic field can be measured is doubled. Even when the nuclear spin transition of nitrogen ($^{14}$N) shown in FIG. 10 is considered, the same result as described above can be obtained.

According to another embodiment, when the second reference signal 920 is the same as the first reference signal 910, that is, the first reference signal 910 and the second reference signal 920 have the same frequency and phase, the lock-in-amplifier signal change ($\Delta S_{LIA,1}$) obtained based on the microwave signal frequency-modulated based on the first reference signal 910 is given as $\Delta S_{LIA,1}=-\alpha(\Delta D-\gamma\Delta B)$, and the lock-in-amplifier signal change ($\Delta S_{LIA,2}$) obtained based on the microwave signal frequency-modulated based on the second reference signal 920 is given as $\Delta S_{LIA,2}=-\alpha(\Delta D+\gamma\Delta B)$. Therefore, the change ($\Delta S_{LIA}$) in the entire lock-in-amplifier output signal becomes $\Delta S_{LIA}=\Delta S_{LIA,1}+\Delta S_{LIA,2}=-2\alpha\Delta D$, the influence of ΔB disappears, and at the same time, the magnitude of the signal of which the change in temperature can be measured is doubled.

As described above, when making the phases of the first reference signal 910 and the second reference signal 920 to be the same, the temperature change can be precisely measured while offsetting the influence of the change in the surrounding magnetic field. When making the phases of the first reference signal 910 and the second reference signal 920 to be 180 degrees to each other, the change in the magnetic field can be precisely measured while offsetting the influence of the temperature change.

In the above measurement result, the zero-crossing inclination (α) depends on applied microwave signal power ($P_{MW}$) and an amplitude of the reference signal used for frequency modulation ($F_{dev}$ shown in FIG. 3). In addition, based on the above, the change in the lock-in-amplifier output signal ($\Delta S_{LIA}$) can be most accurate when the zero-crossing inclination of the spin transition between the spin state ($m_s=0$) and the spin state ($m_s=-1$) and that of the spin transition between the spin state ($m_s=0$) and the spin state ($m_s=+1$) are made equal. Therefore, it is necessary to make the zero-crossing inclination (α) at the respective spin transition be the same by adjusting the power ($P_{MW}$) of the microwave applied for the purpose of causing the two spin transitions and the amplitude ($F_{dev}$) of the reference signal for modulation.

Extending the above-described method, it may be possible to measure temperature and magnetic field in real-time simultaneously. If the frequency (F1) of the first reference signal 910 is different from the frequency (F2) of the second reference signal 920, the DNV sensor signal becomes to have two frequency components (F1 and F2). The frequency components are split and used as input signals of two independent lock-in amplifiers (LIA1 and LIA2), and a first reference signal 910 is connected to LIA1 and a second reference signal 920 is connected to LIA2. By applying this method, $\Delta S_{LIA,1}$ through LIA1 and $\Delta S_{LIA,2}$ through LIA2 can be independently measured, and by obtaining a sum ($\Delta S_{LIA,1} + \Delta S_{LIA,2}$) and a difference ($\Delta S_{LIA,1} - \Delta S_{LIA,2}$)) of the signals measured by a data collecting device, it is possible to measure a magnetic field and a temperature simultaneously in real-time.

When the above-described dual-frequency driving method is used, if a coherent population trapping (CPT) effect occurs, the zero-crossing inclination remarkably decreases, and the magnetic field sensitivity may be rather lowered.

Figure 11:
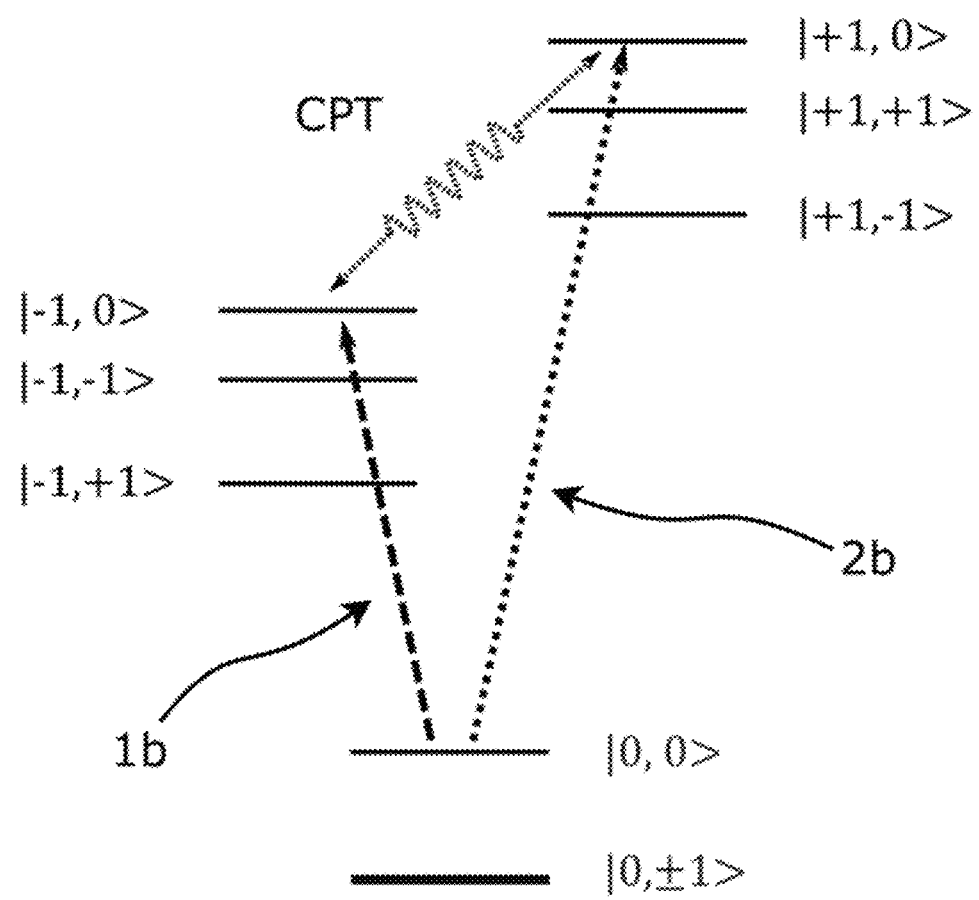
FIG. 11 is a view illustrating a principle of generating a CPT effect.

FIG. 11 is a view illustrating a principle of generating a CPT effect.

Referring to FIG. 11, when two microwaves act on the same |0, 0> state and create a V-shaped spin transition structure, a coherence phenomenon occurs between |−1, 0> and |+1, 0> states, resulting in the CPT effect to occur. It is known that when the CPT effect occurs, the transition between spin states is greatly suppressed even when microwaves are applied thereto.

Figure 12:
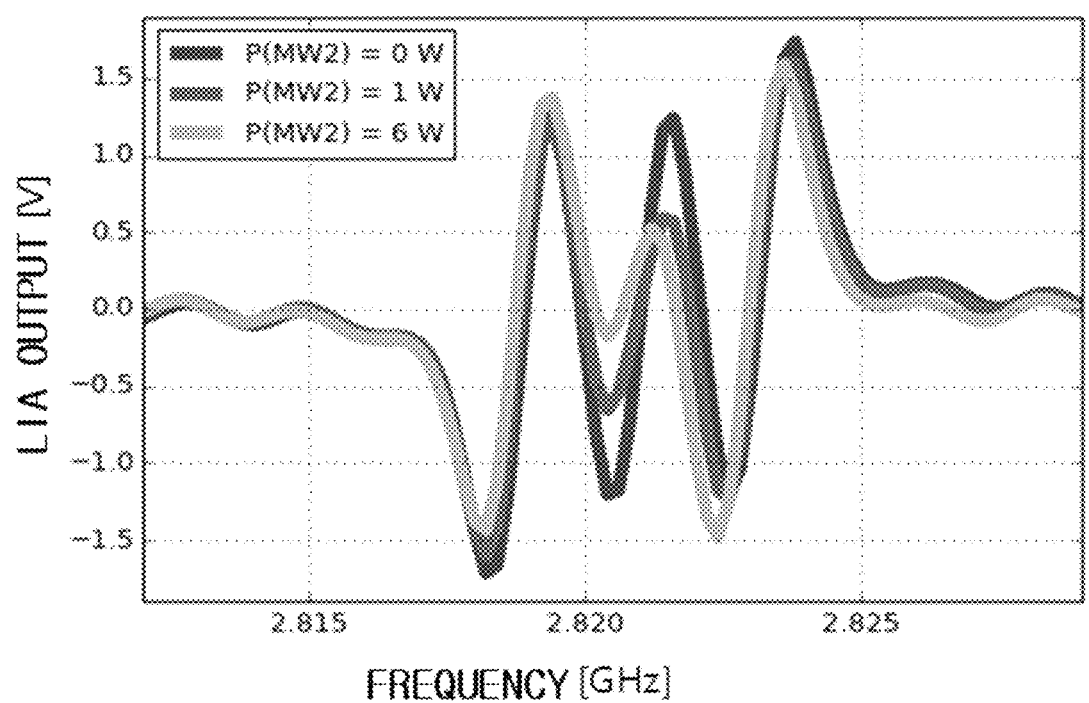
FIG. 12 is a view illustrating an example in which a zero-crossing inclination decreases according to an occurrence of a CPT effect.

FIG. 12 is a view illustrating an example in which a zero-crossing inclination decreases according to an occurrence of a CPT effect.

Referring to FIG. 12, when measuring changes 1a, 1b, and 1c of FIG. 8 while applying the frequency-modulated microwave of the frequency corresponding to the peak 2b of FIG. 8, it is seen that the size of the peak 1b is lowered. As the magnitude (P(MW2)) of the frequency-modulated microwave power of the frequency corresponding to the peak 2b increases, the magnitude of the peak 1b decreases further. As the magnitude of the frequency-modulated microwave power of the frequency corresponding to the peak 2b is increased, the magnitude of the peak 1b is decreased and has a smaller zero-crossing inclination. That is, if applying the dual frequency driving technique to the (1b, 2b) spin transition pair, the output size of the lock-in-amplifier becomes smaller rather than doubled.

In order to avoid the CPT effect illustrated in FIGS. 11 and 12 and to achieve the purpose of dual frequency driving, the V-shaped transition as illustrated in FIG. 12 should be avoided.

Figure 13:
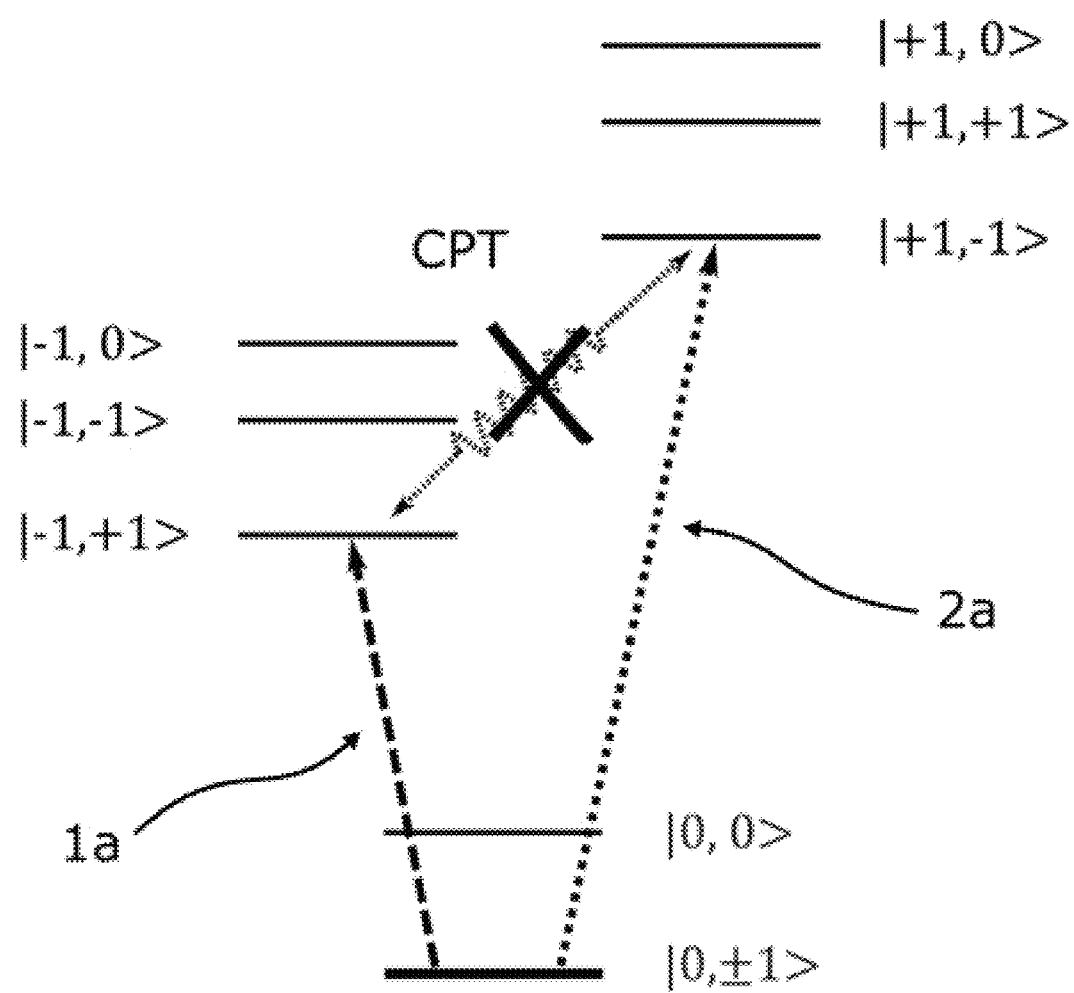
FIGS. 13 and 14 are views illustrating an example of selecting a dual driving frequency in which the CPT effect does not occur.
Figure 14:
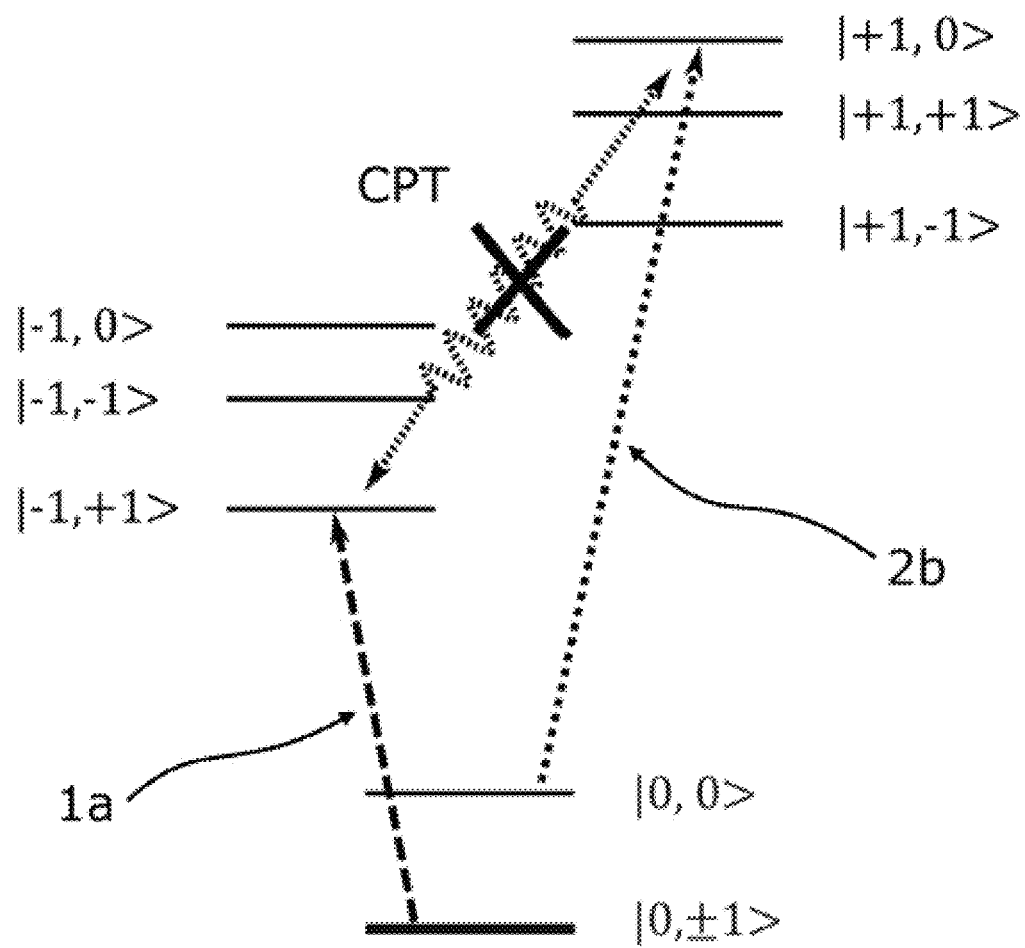

FIGS. 13 and 14 are views illustrating an example of selecting a dual driving frequency in which the CPT effect does not occur.

As in the examples illustrated in FIGS. 13 and 14, when using 1a as one frequency for a spin transition, the corresponding pair should be 2a or 2c. In FIG. 13, |0, −1> and |0, +1> overlap, so it looks like a V-shaped transition, but 2a starts from |0, −1> state, and 1a starts from |0, +1> state, thus they operate in different states. Therefore, there is no V-shaped transition formed. All combinations that can avoid the V-shaped transition are six combinations: (1a, 2a), (1a, 2b), (1b, 2a), (1b, 2c), (1c, 2b) and (1c, 2c). Therefore, in order to use the dual frequency driving method in the diamond nitrogen-vacancy center without the CPT effect, one of the above six combinations should be used.

Figure 15:
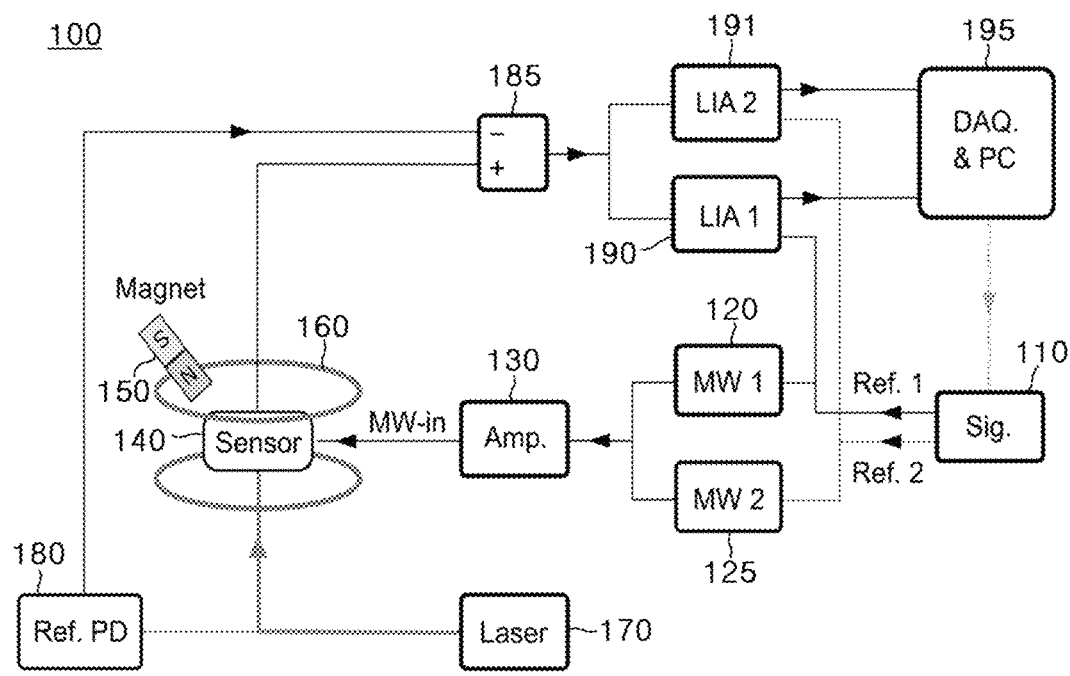
FIG. 15 is a diagram schematically illustrating the apparatus for measuring a magnetic field and a temperature using the diamond nitrogen-vacancy sensor.

FIG. 15 is a diagram schematically illustrating the apparatus for measuring the magnetic field and the temperature using the diamond nitrogen-vacancy sensor.

Referring to FIG. 15, the apparatus 100 for measuring the magnetic field or the temperature using a diamond nitrogen-vacancy center sensor includes a diamond nitrogen-vacancy center sensor 140, a reference signal generator 110, a first microwave generator 120, and a second microwave generator 125, a power amplifier (PA) 130, a laser irradiator 170, a permanent magnet 150, a first lock-in amplifier (LIA) 190, a second lock-in amplifier 191 and a data collection and control unit 195. Additionally, the apparatus 100 may further include a reference detector 180, a differential circuit 185 and a test coil 160.

The reference signal generator 110 may generate a reference signal to be used for frequency modulation. According to the embodiment, the reference signal may be a frequency between 1 KHz and 100 KHz. The reference signal generator 110 may transmit the generated reference signal to the first microwave generator 120, the second microwave generator 125, the first lock-in amplifier 190 and the second lock-in amplifier 191. At this time, when the apparatus 100 is set to measure the magnetic field, the reference signal transmitted to the first microwave generator 120 and the reference signal transmitted to the second microwave generator 125 may be transmitted with each reference signal having the same frequency and getting through phase inversion to have a phase difference of 180 degrees with each other. According to another embodiment, when the apparatus 100 is set to measure a temperature, the reference signal transmitted to the first microwave generator 120 and the reference signal transmitted to the second microwave generator 125 may have the same frequency and the same phase. That is, the same signal may be transmitted. At this time, the reference signal transmitted to the first microwave generator 120 is also transmitted to the first lock-in amplifier 190, and may become a reference signal targeted to be detected by the first lock-in amplifier 190.

According to another embodiment, when the apparatus 100 is set to measure a magnetic field and a temperature at the same time, the reference signal transmitted to the first microwave generator 120 and the reference signal transmitted to the second microwave generator 125 become to have different frequencies with each other. At this time, the reference signal transmitted to the first microwave generator 120 is also transmitted to the first lock-in amplifier 190, and may become a reference signal to be detected by the first lock-in amplifier 190. The reference signal transmitted to the second microwave generator 125 is also transmitted to the second lock-in amplifier 191, and may become a reference signal to be detected by the second lock-in amplifier 191. The data collection and control unit 195 may obtain a sum and difference of the first lock-in-amplifier output signal and the second lock-in-amplifier output signal to precisely measure a change in a magnetic field and a temperature at the same time.

The first microwave generator 120 and the second microwave generator 125 may generate two microwave signals for causing a spin transition of one selected among the six spin transition pairs that do not generate the CPT effect. For example, the first microwave generator 120 may generate a microwave signal that causes the spin transition of 1a of FIG. 7 or 8, and the second microwave generator 125 may generate a microwave signal that causes the spin transition of 2a or 2b of FIG. 7 or 8. In another embodiment, the first microwave generator 120 may generate a microwave signal that causes the spin transition of 1b of FIG. 7 or 8, and the second microwave generator 125 may generate a microwave signal that causes the spin transition of 2a or 2c of FIG. 7 or 8. In this case, the first microwave generator 120 and the second microwave generator 125 may generate a microwave signal that performed frequency modulation based on the reference signal provided by the reference signal generator 110.

The power amplifier 130 may combine the microwave signals generated by the first microwave generator 120 and the second microwave generator 125, and amplify them, and input them to the diamond nitrogen-vacancy center sensor 140.

The laser irradiator 170 may irradiate a laser causing a spin transition to be excited from the ground state 210 to the excited state 220 to the diamond nitrogen-vacancy center sensor 140.

The permanent magnet 150 may apply a constant static magnetic field to the diamond nitrogen-vacancy center sensor 140. A precise frequency of the microwave signals generated by the first microwave generator 120 and the second microwave generator 125 may be determined based on the static magnetic field applied by the permanent magnet 150. When it comes to the spin quantum of the diamond nitrogen-vacancy center sensor 140, two spin transitions are caused by the microwave signals generated and input by the first microwave generator 120 and the second microwave generator 125, and after being excited to the excited state 220 by the laser irradiated by the laser irradiator 170, the spin quantum returns to the ground state 210, with fluorescence being generated.

Figure 16:
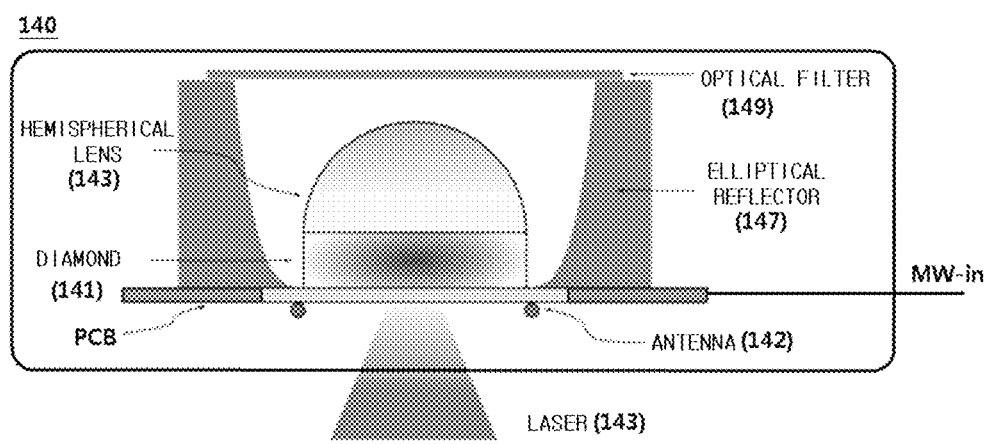
FIG. 16 is a view illustrating an example of the diamond nitrogen-vacancy center sensor.

FIG. 16 is a view illustrating an example of the diamond nitrogen-vacancy center sensor.

Referring to FIG. 16, the diamond nitrogen-vacancy center sensor 140 uses diamond 141 including nitrogen-vacancy centers, and the nitrogen-vacancy centers may produce red fluorescence of 600 nm or more, which are generated after exposed to the excitation by a 532 nm laser 143. Red fluorescence generated from the diamond 141 may be collected by a hemispherical lens 145, an elliptical reflector 147, and an optical filter 149 and transmitted to a detector (not illustrated). The output of the detector may be passed to a differential circuit 185. An antenna 142 for generating microwaves inducing a spin transition may be positioned under the diamond 141. Microwaves generated by the first microwave generator 120 and the second microwave generator 125 may be applied to the diamond 141 through the antenna 142.

Referring back to FIG. 12, the first lock-in amplifier 190 or the second lock-in amplifier 191 may receive fluorescence generated from the diamond nitrogen-vacancy center sensor 140 and output a result obtained by comparing the fluorescence with a reference signal.

According to the embodiment, the apparatus 100 may additionally include a reference detector 180 and a differential circuit 185 in order to cancel noise of the laser in the first lock-in amplifier 190 and the second lock-in amplifier 191.

The reference detector 180 may measure power of the laser input to the diamond nitrogen-vacancy center sensor 140 and transmit it to the differential circuit 185.

The differential circuit 185 performs a common noise rejection (CNR) function that acquires only a differential signal that is a difference between the laser measurement signal coming from the reference detector 180 and the output signal of the diamond nitrogen-vacancy sensor 140, thereby cancelling the noise caused by the laser.

The apparatus 100 may additionally include a test coil 160 that applies a calibrated test magnetic field to measure the magnetic field sensitivity of the apparatus 100.

The data collection and control unit 195 may control the magnetic field measurement and/or temperature measurement using the apparatus 100. The data collection and control unit 195 may set whether the apparatus 100 measures magnetic field, temperature, or both magnetic field and temperature. According to the embodiment, the data collection and control unit 195 may set magnetic field measurement and/or temperature measurement based on an operator's input. Based on the setting of the control unit 195, the reference signal generator 110 may generate reference signals whose phases are inverted to each other for measuring a magnetic field, or generate reference signals having the same phase with each other for measuring a temperature, or generate reference signals having different frequencies for measuring a magnetic field and temperature.

In addition, the data collection and control unit 195 may set the microwave frequency to be generated by the first microwave generator 120 and the second microwave generator 125 and provide it to the first microwave generator 120 and the second microwave generator 125. According to the embodiment, based on an operator's input, the control unit 195 may set a microwave frequency to be generated, or automatically select and set a pair having the most similar zero-crossing inclination from among six frequency pairs available based on a measured result.

In addition, the data collection and control unit 195 may set the amplitude ($F_{dev}$) of the reference signal and the power ($P_{MW}$) of the microwave injected into the diamond nitrogen-vacancy sensor 140 determined by the power amplifier 130. Since the amplitude of the reference signal ($F_{dev}$) and the power of the microwave ($P_{MW}$) affect the zero-crossing inclination ($\alpha$), the zero-crossing inclination ($\alpha$) at a frequency corresponding to the two spin transitions should be the same in order to maximize the offsetting influence of the temperature changes or the magnetic field changes. Accordingly, the control unit 195 may set the amplitude ($F_{dev}$) of the reference signal and the power ($P_{MW}$) of the microwave so that the zero-crossing inclinations ($\alpha$) at a frequency corresponding to the two spin transitions can become as identical as possible. Also, according to the embodiment, the data collection and control unit 195 may determine the amplitude ($F_{dev}$) of the reference signal so that the lock-in amplifier output has a shape shown in FIG. 4. When the amplitude ($F_{dev}$) of the reference signal is small, referring to FIG. 3, there may be a maximum point and a minimum point in a certain frequency range. Accordingly, the maximum and minimum points of the output of the lock-in amplifier of FIG. 4 may appear the same within a certain range. Accordingly, the control unit 195 may determine the amplitude ($F_{dev}$) of the reference signal from which a shape of an output of the lock-in amplifier shown in FIG. 4 can be obtained through repeated experiments.

Also, the data collection and control unit 195 may collect output data from the first lock-in amplifier 190 and/or the second lock-in amplifier 191 and measure a change in temperature and/or a change in a magnetic field using the results.

In addition, the data collection and control unit 195 may control the overall flow of a method for measuring a magnetic field or a temperature of the apparatus 100, which will be described with reference to FIG. 17.

According to various embodiments, a measuring apparatus based on a diamond nitrogen-vacancy center (DNV) sensor may include: a diamond nitrogen-vacancy center sensor; a frequency synthesizer for generating a first reference signal and a second reference signal; a first microwave generator for generating a first microwave that is frequency modulated based on the first reference signal and causes a first spin transition in the diamond nitrogen-vacancy center sensor; a second microwave generator for generating a second microwave that is frequency modulated based on the second reference signal and causes a second spin transition in the diamond nitrogen-vacancy center sensor; a laser irradiator for applying a laser to excite a spin quantum of the diamond nitrogen-vacancy center sensor; a power amplifier for combining and amplifying the first microwave and the second microwave to apply to the diamond nitrogen-vacancy center sensor; a detector for detecting a fluorescence signal output from the diamond nitrogen-vacancy center sensor; a reference detector for measuring power of the laser; a differential circuit for outputting a difference between an output signal of the detector and an output signal of the reference detector; a first lock-in amplifier for outputting a result of comparing an output of the differential circuit with the first reference signal, and a second lock-in amplifier for outputting a result of comparing an output of the differential circuit with the second reference signal.

According to various embodiments, the frequency synthesizer generates the first reference signal and the second reference signal to have a phase inverted by 180 degrees when measuring a magnetic field, generates the first reference signal and the second reference signal to have the same phase when measuring a temperature, and generates the first reference signal and the second reference signal to have different frequencies when measuring a magnetic field and a temperature at the same time.

According to various embodiments, the measuring apparatus based on a diamond nitrogen-vacancy center (DNV) sensor may further include: a permanent magnet for applying a constant static magnetic field to the diamond nitrogen-vacancy center sensor.

According to various embodiments, the measuring apparatus based on a diamond nitrogen-vacancy center (DNV) sensor may further include: a test coil for applying a calibrated test magnetic field to measure a magnetic field sensitivity of the measuring apparatus.

According to various embodiments, the measuring apparatus based on a diamond nitrogen-vacancy center (DNV) sensor may further include: a data collection and control unit, and the data collection and control unit sets parameters for measurement, and estimate a magnetic field and/or temperature based on outputs of the first lock-in amplifier and/or the second lock-in amplifier, and the parameter may include: a first parameter for indicating whether to measure a magnetic field, a temperature, or a magnetic field and a temperature at the same time; a parameter for indicating an amplitude, phase, and frequency of the first reference signal and the second reference signal; and a parameter for indicating a frequency of the first microwave and a frequency of the second microwave.

According to various embodiments, the data collection and control unit may estimate a magnetic field or temperature based on an output of the first lock-in amplifier or the second lock-in amplifier, when measurement of a magnetic field only or a temperature only is set; and estimate a magnetic field and temperature at the same time based on a result of adding and a result of subtracting outputs of the first lock-in amplifier and the second lock-in amplifier, when measurement of a magnetic field and a temperature at the same time is set.

According to various embodiments, frequencies of the first microwave and the second microwave may be a pair of frequencies that do not generate a coherent population trapping (CPT) effect among frequencies corresponding to spin transitions that occur in the diamond nitrogen-vacancy center sensor.

Figure 17:
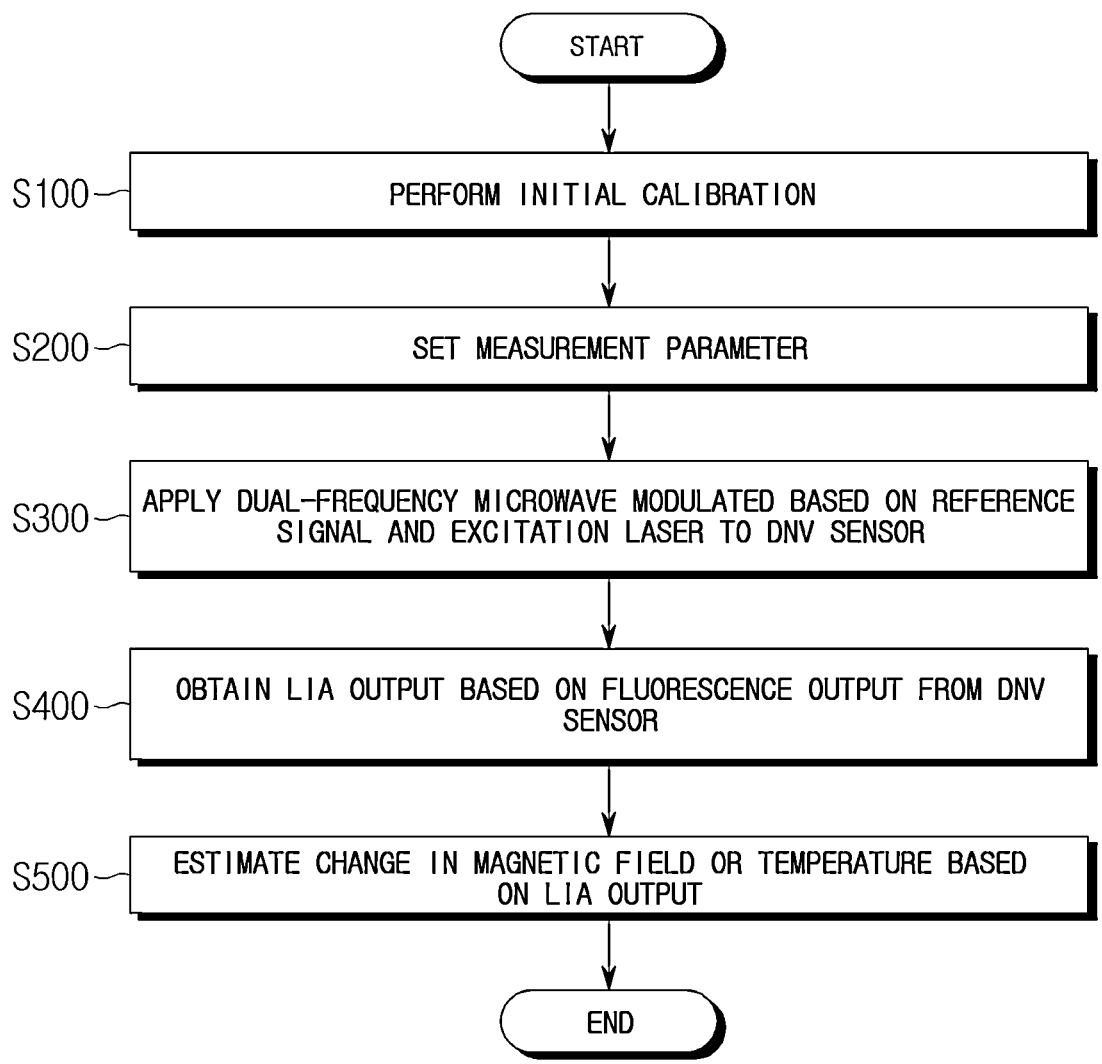
FIG. 17 is a flowchart illustrating a method for measuring a magnetic field or a temperature with the apparatus for measuring a magnetic field and a temperature using the diamond nitrogen vacancy center sensor.

FIG. 17 is a flowchart illustrating a method for measuring a magnetic field or a temperature with the apparatus 100 for measuring a magnetic field and a temperature using the diamond nitrogen vacancy center sensor.

Referring to FIG. 17, in a step S100, the apparatus 100 may perform initial calibration. The apparatus 100 may obtain and store basic parameters for a measurement operation of the apparatus 100 through a test in a chamber in which there is no magnetic field other than the reference magnetic field applied by the permanent magnet 150, during the initial calibration. For example, the apparatus 100 may obtain, through initial calibration, frequencies corresponding to spin transitions of 1a to 1c and 2a to 2c as illustrated in FIG. 8.

Figure 18:
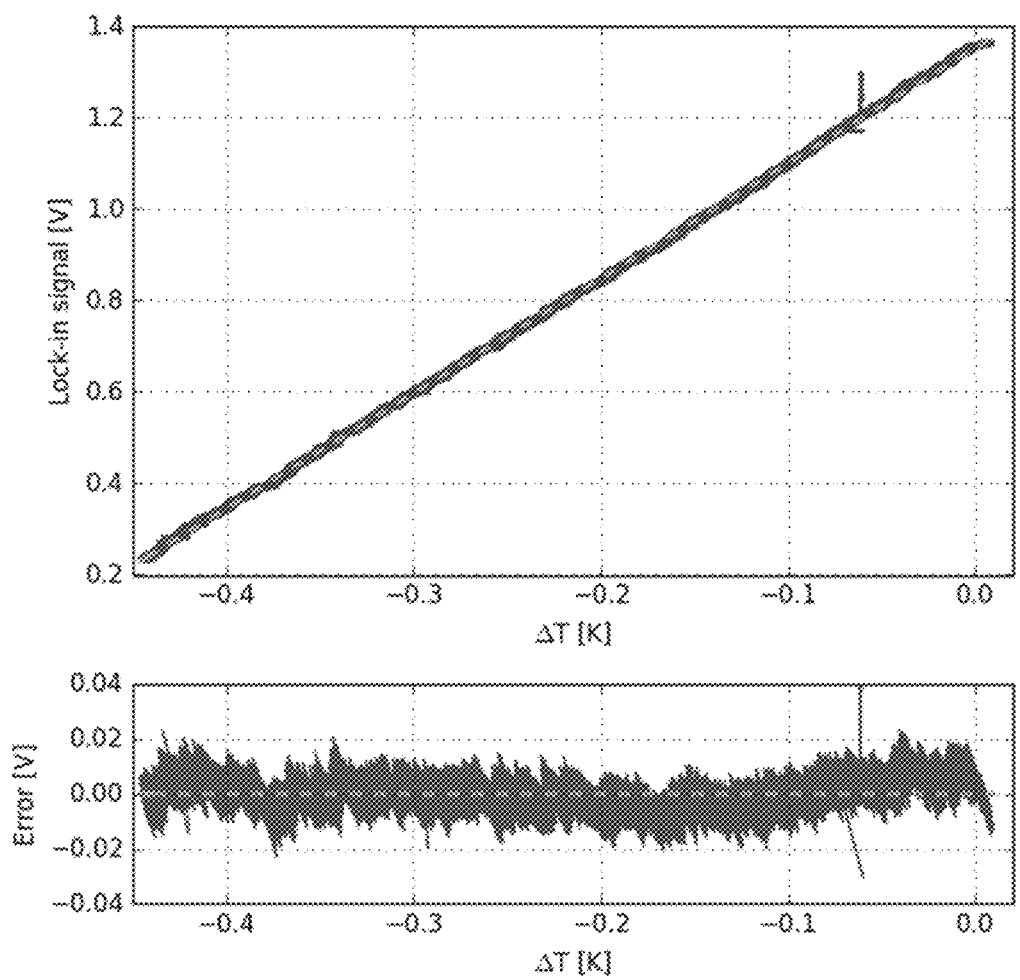
FIG. 18 is a view illustrating an example of calibrating a temperature value measured by the diamond nitrogen-vacancy center sensor using a linear relationship between an actual temperature change of the diamond nitrogen-vacancy center sensor and a measured temperature signal.

In addition, during the initial calibration, the apparatus 100 may obtain a linear relationship between the actual temperature change and the lock-in-amplifier result signal of the diamond nitrogen-vacancy center sensor as illustrated in FIG. 18, by comparing a temperature signal measured by the diamond nitrogen-vacancy center sensor at predetermined reference temperatures (e.g., 22, 23 degrees) or a temperature change range (e.g., between 22 and 23 degrees) and set an equation for obtaining an actual temperature measurement value using this linear relationship.

In addition, since the apparatus 100 knows the magnetic field and temperature applied to the DNV sensor 140, the apparatus 100 may calculate and obtain the parameter γ. In addition, the apparatus 100 may acquire the zero-crossing inclination (α) based on the output of the lock-in amplifier illustrated in FIG. 5 or FIG. 6 during the initial calibration. In particular, the apparatus 100 may determine, during the initial calibration, the amplitude ($F_{dev}$) of the reference frequency and the power ($P_{MW}$) of the dual-frequency microwaves such that the zero-crossing inclinations (α) corresponding to each of the dual frequencies can become as identical as possible.

The apparatus 100 may perform the initial calibration only once for the first time, may perform it before every measurement, or periodically according to a calibration cycle.

In a step of S200, the apparatus 100 may set a measurement parameter. The apparatus 100 may set whether to measure a magnetic field, measure a temperature, or measure a magnetic field and a temperature at the same time. Also, the apparatus 100 may set which of the six frequency pairs to use to cause a spin transition without causing the CPT effect. For example, the apparatus 100 may set one selected among six frequency pairs, (1a, 2a), (1a, 2b), (1b, 2a), (1b, 2c), (1c, 2b) and (1c, 2c) as illustrated in FIG. 8, as dual frequencies to be used. In addition, the apparatus 100 may set the amplitude ($F_{dev}$) of the reference signal and the power ($P_{MW}$) of the dual frequency microwave. The values used at the time of the initial calibration determined in the step of S100 may be used as they are. According to the embodiment, the apparatus 100 may set the above-described measurement parameter based on a user's input.

In a step of S300, the apparatus 100 may apply the dual-frequency microwave modulated based on the reference signal and the excitation laser to the DNV sensor 140. The apparatus 100 may generate microwaves having two frequencies of the frequency pair set in the step of S200 and apply them to the DNV sensor 140. In this case, the apparatus 100 may modulate the two frequencies based on the reference signal. Also, when measuring a change in a magnetic field, the apparatus 100 may modulate one of the two frequencies based on the reference signal and the other one based on the reference signal that is phase-inverted by 180 degrees. On the other hand, when measuring a change in a temperature, the apparatus 100 may modulate both frequencies based on the same reference signal. When measuring a magnetic field and a temperature simultaneously, the two frequencies may be frequency-modulated based on reference signals having different frequencies.

Also, the apparatus 100 may apply a laser of 532 nm to the DNV sensor 140 to excite the spin quantum from the ground state to the excited state.

In a step of S400, the apparatus 100 extracts and outputs only a frequency component the same as the reference signal from the fluorescence signals output from the DNV sensor 140 using the first lock-in amplifier 190 and/or the second lock-in amplifier 191. According to the embodiment, the apparatus 100 measures the power of the laser applied to the DNV sensor 140 to obtain a differential signal between the fluorescence output from the DNV sensor 140 and the power of the laser, and may use the obtained differential signal as an input of the first lock-in-amplifier 190 and/or the second lock-in-amplifier 191. In this case, a noise component included in the laser may be removed, thereby measurement accuracy can be improved. If a magnetic field and a temperature are simultaneously measured, since the two frequencies are frequency-modulated based on the reference signals each having a different frequency, the first lock-in amplifier 190 may extract and output a frequency component the same as the first reference signal, and the second lock-in amplifier 191 may extract and output a frequency component the same as the second reference signal.

In a step of S500, the apparatus 100 may estimate a change in a magnetic field and/or temperature based on an output of the first lock-in-amplifier 190 and/or the second lock-in-amplifier 191. By applying a dual frequency to the DNV sensor 140, an output of the first lock-in-amplifier 190 or the second lock-in-amplifier 191 may include a result according to a change in only a magnetic field or temperature. That is, when the dual frequencies have the same frequency and are modulated based on the reference signal whose phase is inverted, the output change ($\Delta S_{LIA}$) of the first lock-in amplifier 190 or the second lock-in amplifier 191 becomes $\Delta S_{LIA}=2\alpha\gamma\Delta B$, and as an influence of a temperature change disappears, a magnitude of a signal from which a change in a magnetic field can be measured is doubled. Therefore, a change ($\Delta B$) in a magnetic field may be estimated as $\Delta B=\Delta S_{LIA}/2\alpha\gamma$.

According to another embodiment, when the dual frequency is modulated based on reference signals having the same phase, an output change ($\Delta S_{LIA}$) of the first lock-in amplifier 190 or the second lock-in amplifier 191 becomes $\Delta S_{LIA}=-2\alpha\Delta D$. At the same time, as an influence of the magnetic field change disappears, the magnitude of the signal from which a change in a magnetic field can be measured is doubled. Therefore, a change in a temperature ($\Delta T$) may be estimated as $\Delta T=\Delta S_{LIA}/(-2\alpha^*\kappa)$. Here, $\kappa=|\Delta D/\Delta Y|$, which is a temperature-dependent constant of D.

According to another embodiment, in order to simultaneously measure a magnetic field and a temperature, when the dual frequencies are respectively modulated based on reference signals having different frequencies, the magnetic field change and the temperature change may be simultaneously estimated by acquiring the output change ($\Delta S_{LIA,1}$) of the first lock-in-amplifier 190 and the output change ($\Delta S_{LIA,2}$) of the second lock-in amplifier 191 and adding or subtracting the two output changes.

Figure 19:
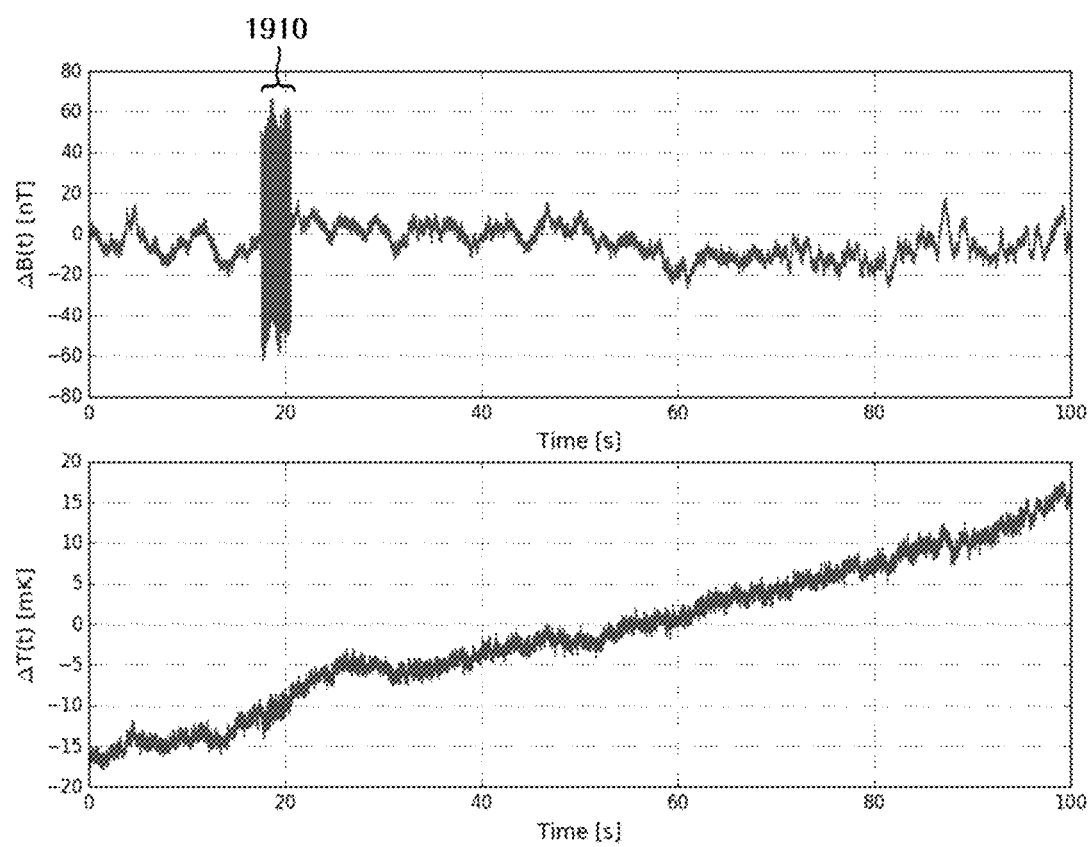
FIG. 19 is a view illustrating an example of changes in a magnetic field and a temperature measured simultaneously by the apparatus for measuring a magnetic field and a temperature using the diamond nitrogen-vacancy center sensor proposed by the present invention.

FIG. 19 is a view illustrating an example of changes in a magnetic field and a temperature measured simultaneously by the apparatus for measuring a magnetic field and a temperature using the diamond nitrogen-vacancy center sensor proposed by the present invention.

Referring to FIG. 19, it can be seen that the apparatus for measuring a magnetic field and a temperature using a diamond nitrogen-vacancy center sensor proposed in the present invention may simultaneously measure a temperature change and a magnetic field change, and in particular, a time period 1910 shows a result of applying a sudden change to a magnetic field for the test, and the result shows that the apparatus for measuring a magnetic field and a temperature using the diamond nitrogen-vacancy center sensor proposed in the present invention can not only precisely measure a magnetic field change, but also a temperature change.

According to various embodiments, a method for measurement based on a diamond nitrogen-vacancy center sensor may include: setting a parameter for measurement; generating a first reference signal and a second reference signal; applying, to the diamond nitrogen-vacancy center sensor, a first microwave that is frequency modulated based on the first reference signal and causes a first spin transition and a second microwave that is frequency modulated based on the second reference signal and causes a second spin transition; applying a laser to excite a spin quantum to the diamond nitrogen-vacancy center sensor; outputting a differential signal indicating a difference between a fluorescence signal outputted from the diamond nitrogen-vacancy center sensor and an output signal of the laser; outputting a first result obtained by comparing the differential signal with the first reference signal; outputting a second result obtained by comparing the differential signal with the second reference signal; and measuring a change in a magnetic field and/or temperature based on the first result and/or the second result.

According to various embodiments, the generating a first reference signal and a second reference signal may include: generating the first reference signal and the second reference signal to have a phase inverted by 180 degrees when measuring a magnetic field, generating the first reference signal and the second reference signal to have the same phase when measuring a temperature, and generating the first reference signal and the second reference signal to have different phases when measuring a magnetic field and a temperature at the same time.

According to various embodiments, the method for measurement based on a diamond nitrogen-vacancy center sensor may further include: applying a constant static magnetic field to the diamond nitrogen-vacancy center sensor.

According to various embodiments, the parameter may include: a first parameter for indicating whether to measure a magnetic field, a temperature, or a magnetic field and a temperature at the same time; a parameter for indicating an amplitude, phase, and frequency of the first reference signal and the second reference signal; and a parameter for indicating a frequency of the first microwave and a frequency of the second microwave.

According to various embodiments, the measuring a change in a magnetic field and/or temperature based on the first result and/or the second result may include: measuring the change in a magnetic field or a temperature based on the first result or the second result when the first parameter is set to measure a temperature or to measure a magnetic field; and measuring the change in a magnetic field and a temperature based on a value obtained by adding and a value obtained by subtracting the first result and the second result when the first parameter is set to measure a temperature and a magnetic field at the same time.

According to various embodiments, frequencies of the first microwave and the second microwave may be a pair of frequencies that do not generate a coherent population trapping (CPT) effect among frequencies corresponding to spin transitions that occur in the diamond nitrogen-vacancy center sensor.

According to various embodiments, the method for measurement based on a diamond nitrogen-vacancy center sensor may further include: performing initial calibration of a diamond nitrogen-vacancy center sensor.

According to various embodiments, the performing initial calibration may include: acquiring frequency information causing a spin transition of the diamond nitrogen-vacancy center sensor at a predetermined reference temperature and a reference magnetic field; and determining amplitudes of the first reference signal and the second reference signal; determining power of the first microwave and the second microwave applied to the diamond nitrogen-vacancy center sensor.

As described above, by canceling one among the temperature change and the magnetic field change that influences the spin transition frequency of the diamond nitrogen-vacancy center sensor, the method and apparatus proposed in the present disclosure may measure a change in the other one more precisely.

The invention claimed is:

1. A measuring apparatus based on a diamond nitrogen-vacancy center (DNV) sensor, comprising:
   a diamond nitrogen-vacancy center sensor;
   a frequency synthesizer for generating a first reference signal and a second reference signal;
   a first microwave generator for generating a first microwave that is frequency modulated according to the first reference signal and causes a first spin transition in the diamond nitrogen-vacancy center sensor;
   a second microwave generator for generating a second microwave that is frequency modulated according to the second reference signal and causes a second spin transition in the diamond nitrogen-vacancy center sensor;
   a laser irradiator for applying a laser to excite a spin state of the diamond nitrogen-vacancy center sensor;
   a power amplifier for combining and amplifying the first microwave and the second microwave to apply to the diamond nitrogen-vacancy center sensor;
   a detector for detecting a fluorescence signal output from the diamond nitrogen-vacancy center sensor;
   a reference detector for measuring power of the laser;
   a differential circuit for outputting a difference between an output signal of the detector and an output signal of the reference detector;
   a first lock-in amplifier for outputting a result of comparing an output of the differential circuit with the first reference signal, and
   a second lock-in amplifier for outputting a result of comparing an output of the differential circuit with the second reference signal.

2. The measuring apparatus of claim 1,
   wherein the frequency synthesizer generates the first reference signal and the second reference signal to have a phase inverted by 180 degrees when measuring magnetic field,
   generates the first reference signal and the second reference signal to have the same phase when measuring temperature, and
   generates the first reference signal and the second reference signal to have different frequencies when measuring magnetic field and temperature at the same time.

3. The measuring apparatus of claim 1, further comprising:
   a permanent magnet for applying a constant static magnetic field to the diamond nitrogen-vacancy center sensor.

4. The measuring apparatus of claim 3, further comprising:
   a test coil for applying a calibrated test magnetic field to measure a magnetic field sensitivity of the measuring apparatus.

5. The measuring apparatus of claim 1, further comprising:
   a data collection and control unit,
   wherein the data collection and control unit set parameters for measurement, and estimates at least one of magnetic field and temperature based on outputs of at least one of the first lock-in amplifier and the second lock-in amplifier, and
   wherein the parameter includes:
   a first parameter for indicating whether to measure magnetic field, temperature, or magnetic field and temperature at the same time;
   a parameter for indicating an amplitude, phase, and frequency of the first reference signal and the second reference signal; and
   a parameter for indicating a frequency of the first microwave and a frequency of the second microwave.

6. The measuring apparatus of claim 5,
   wherein the data collection and control unit:
   estimates magnetic field or temperature based on the output of the first lock-in amplifier or the second lock-in amplifier, when measurement of magnetic field only or temperature only is set; and
   estimates magnetic field and temperature at the same time based on a result of adding and a result of subtracting outputs of the first lock-in amplifier and the second lock-in amplifier, when measurement of magnetic field and temperature at the same time is set.

7. The measuring apparatus of claim 1,
   wherein frequencies of the first microwave and the second microwave are a pair of frequencies that do not generate a coherent population trapping (CPT) effect among frequencies corresponding to spin transitions that occur in the diamond nitrogen-vacancy center sensor.

8. A method for measurement based on a diamond nitrogen-vacancy center sensor, comprising:
   setting a parameter for measurement;
   generating a first reference signal and a second reference signal;
   applying, to the diamond nitrogen-vacancy center sensor, a first microwave that is frequency modulated according to the first reference signal and causes a first spin transition and a second microwave that is frequency modulated according to the second reference signal and causes a second spin transition;

applying a laser to excite a spin state to the diamond nitrogen-vacancy center sensor;
outputting a differential signal indicating a difference between a fluorescence signal outputted from the diamond nitrogen-vacancy center sensor and an output signal of the laser;
outputting a first result obtained by comparing the differential signal with the first reference signal;
outputting a second result obtained by comparing the differential signal with the second reference signal; and
measuring a change in at least one of magnetic field and temperature based on at least one of the first result and the second result.

9. The method for measurement based on a diamond nitrogen-vacancy center sensor of claim 8,
wherein the generating a first reference signal and a second reference signal comprises:
generating the first reference signal and the second reference signal to have a phase inverted by 180 degrees when measuring magnetic field,
generating the first reference signal and the second reference signal to have the same phase when measuring temperature, and
generating the first reference signal and the second reference signal to have different phases when measuring magnetic field and temperature at the same time.

10. The method for measurement based on a diamond nitrogen-vacancy center sensor of claim 8, further comprising:
applying a constant static magnetic field to the diamond nitrogen-vacancy center sensor.

11. The method for measurement based on a diamond nitrogen-vacancy center sensor of claim 8,
wherein the parameter includes:
a first parameter for indicating whether to measure magnetic field, temperature, or magnetic field and temperature at the same time;
a parameter for indicating an amplitude, phase, and frequency of the first reference signal and the second reference signal; and
a parameter for indicating a frequency of the first microwave and a frequency of the second microwave.

12. The method for measurement based on a diamond nitrogen-vacancy center sensor of claim 11,
wherein the measuring a change in at least one of magnetic field and temperature based on at least one of the first result and the second result comprises:
measuring the change in magnetic field or temperature based on the first result and the second result when the first parameter is set to measure temperature or to measure magnetic field; and
measuring the change in magnetic field and temperature based on a value obtained by adding and a value obtained by subtracting the first result and the second result when the first parameter is set to measure temperature and magnetic field at the same time.

13. The method for measurement based on a diamond nitrogen-vacancy center sensor of claim 8,
wherein frequencies of the first microwave and the second microwave are a pair of frequencies that do not generate a coherent population trapping (CPT) effect among frequencies corresponding to spin transitions that occur in the diamond nitrogen-vacancy center sensor.

14. The method for measurement based on a diamond nitrogen-vacancy center sensor of claim 8, further comprising:
performing initial calibration of the diamond nitrogen-vacancy center sensor.

15. The method for measurement based on a diamond nitrogen-vacancy center sensor of claim 14,
wherein the performing initial calibration comprises:
acquiring frequency information causing a spin transition of the diamond nitrogen-vacancy center sensor at a predetermined reference temperature and a reference magnetic field; and
determining amplitudes of the first reference signal and the second reference signal;
determining power of the first microwave and the second microwave applied to the diamond nitrogen-vacancy center sensor.

* * * * *